US012525429B2

(12) United States Patent
Tamaki

(10) Patent No.: US 12,525,429 B2
(45) Date of Patent: Jan. 13, 2026

(54) CHARGED PARTICLE BEAM SYSTEM

(71) Applicant: Hitachi High-Tech Corporation, Tokyo (JP)

(72) Inventor: Hirokazu Tamaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 411 days.

(21) Appl. No.: 17/795,278

(22) PCT Filed: Mar. 26, 2020

(86) PCT No.: PCT/JP2020/013743
§ 371 (c)(1),
(2) Date: Jul. 26, 2022

(87) PCT Pub. No.: WO2021/192164
PCT Pub. Date: Sep. 30, 2021

(65) Prior Publication Data
US 2023/0093287 A1 Mar. 23, 2023

(51) Int. Cl.
*H01J 37/28* (2006.01)
*H01J 37/153* (2006.01)
(Continued)

(52) U.S. Cl.
CPC ............ *H01J 37/28* (2013.01); *H01J 37/153* (2013.01); *H01J 37/21* (2013.01); *H01J 2237/1534* (2013.01)

(58) Field of Classification Search
CPC .......... H01J 37/28; H01J 37/153; H01J 37/21; H01J 2237/1534; H01J 2237/1532; H01J 37/222
See application file for complete search history.

(56) References Cited

U.S. PATENT DOCUMENTS

| | | | | |
|---|---|---|---|---|
| 4,214,163 A * | 7/1980 | Namae | .................. | H01J 37/153 250/396 ML |
| 4,605,860 A * | 8/1986 | Fukuhara | .............. | H01J 37/304 250/397 |

(Continued)

FOREIGN PATENT DOCUMENTS

| | | |
|---|---|---|
| JP | 61-2251 A | 1/1986 |
| JP | S612251 A * | 1/1986 |
| JP | 2003-016983 A | 1/2003 |

OTHER PUBLICATIONS

English Translation of JPS61251A (Year: 1986).*
International Search Report, PCT/JP2020/013743, Jun. 30, 2020, 2 pgs.

*Primary Examiner* — Michael J Logie
*Assistant Examiner* — Laura Eloise Tandy
(74) *Attorney, Agent, or Firm* — Volpe Koenig

(57) ABSTRACT

A charged particle beam system includes: a charged particle beam device configured to emit a charged particle beam from a charged particle source to a sample via a charged particle optical system; and a control system configured to control the charged particle beam device. The control system scans the sample with the charged particle beam in a manner of forming a scan trajectory and determines scores of signal intensities associated with different scan directions in the scan trajectory. The control system generates, based on a relation between the scores and the different scan directions, information on at least one of a focus deviation and an aberration coefficient of the charged particle optical system.

16 Claims, 21 Drawing Sheets

(51) Int. Cl.
*H01J 37/21* (2006.01)
*H01J 37/22* (2006.01)

(56) References Cited

U.S. PATENT DOCUMENTS

| | | | | |
|---|---|---|---|---|
| 5,952,667 | A * | 9/1999 | Shimizu | H01J 37/3174 250/492.23 |
| 2003/0006371 | A1 | 1/2003 | Watanabe et al. | |
| 2004/0149933 | A1* | 8/2004 | Kawamura | B82Y 10/00 250/492.1 |
| 2009/0008550 | A1* | 1/2009 | Nakano | H01J 37/28 250/310 |
| 2020/0395189 | A1* | 12/2020 | Inoue | H01J 37/09 |

* cited by examiner

[FIG. 1]
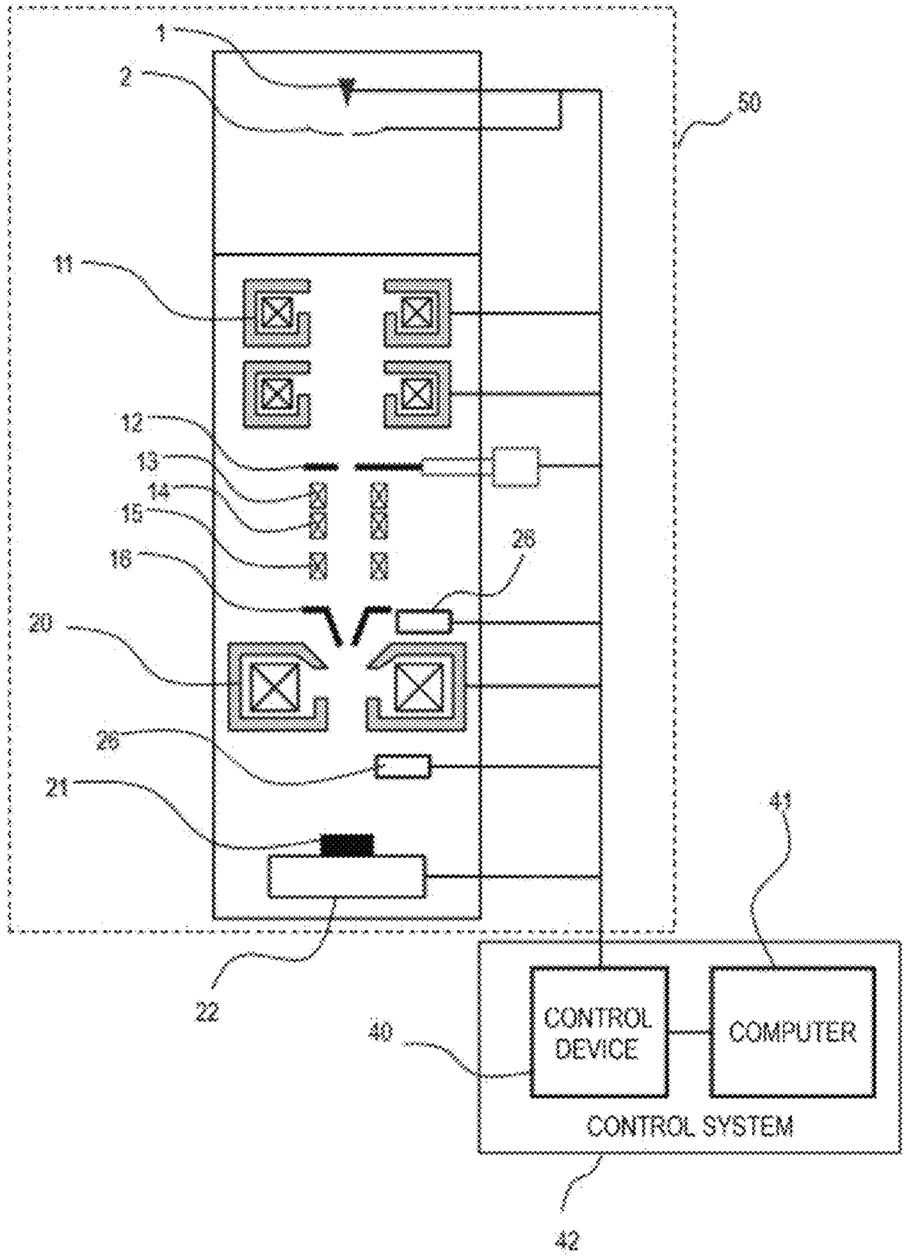

[FIG. 2]
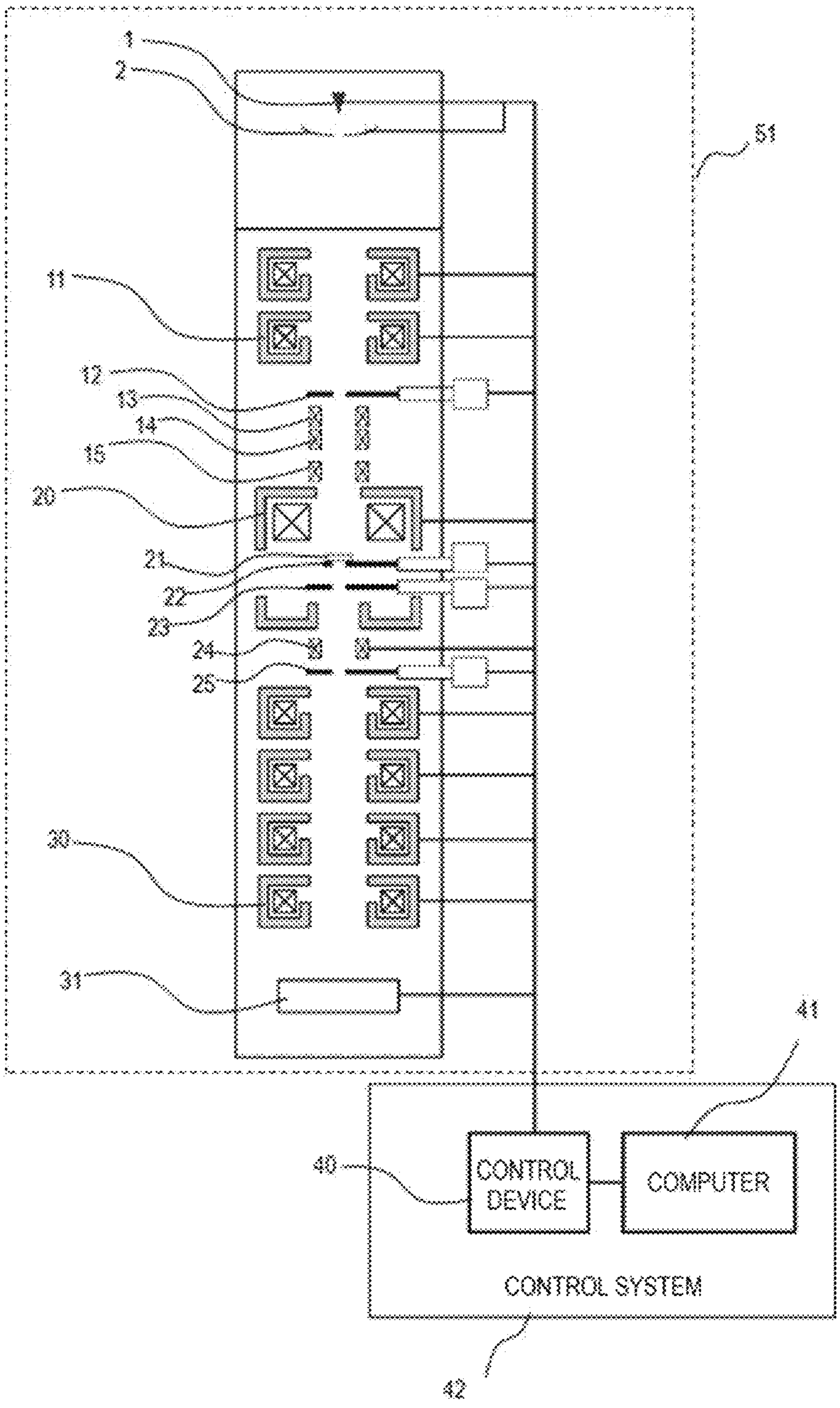

[FIG. 3]
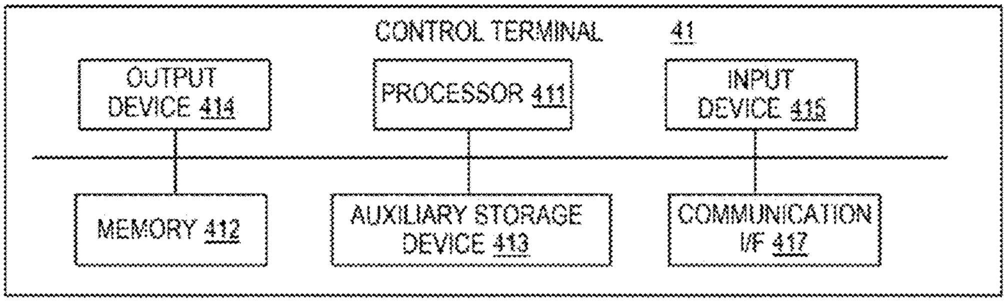
[FIG. 4]
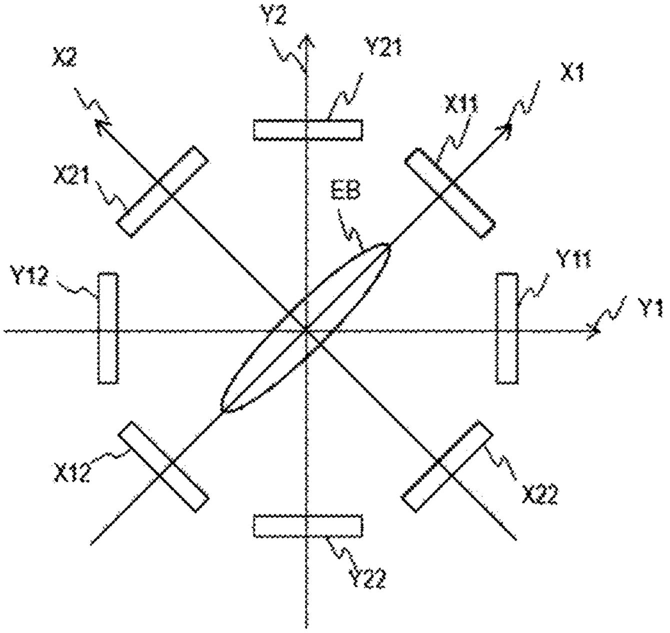

[FIG. 5]
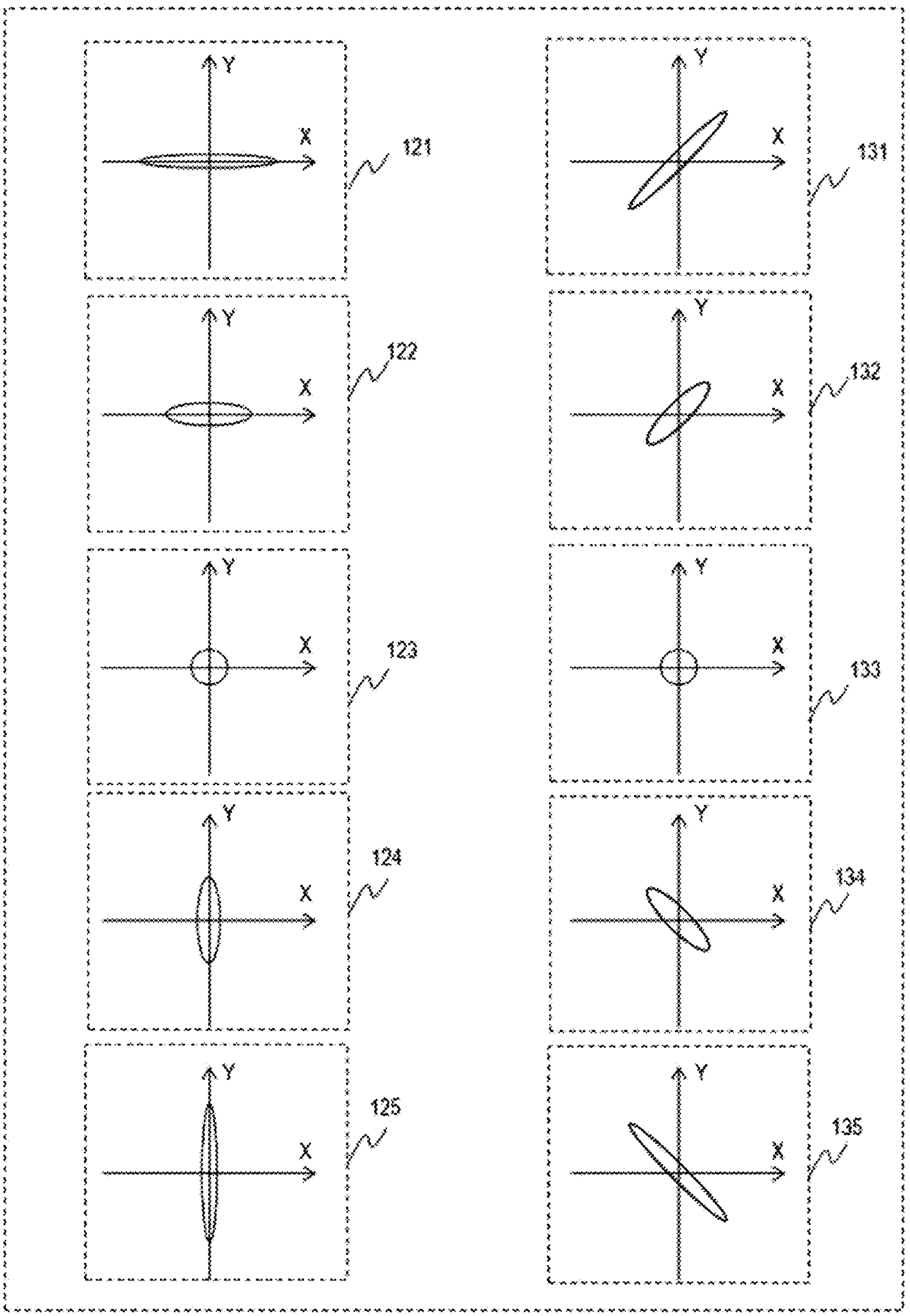

[FIG. 6]
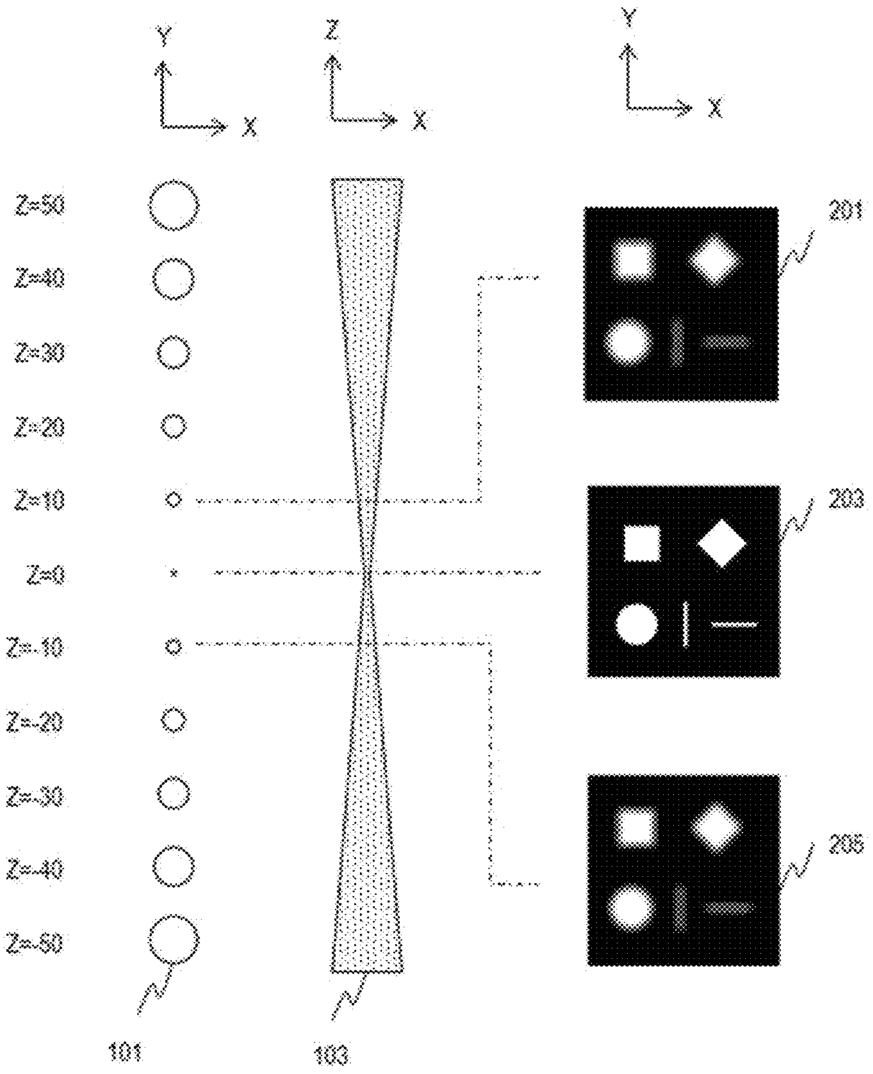

[FIG. 7]
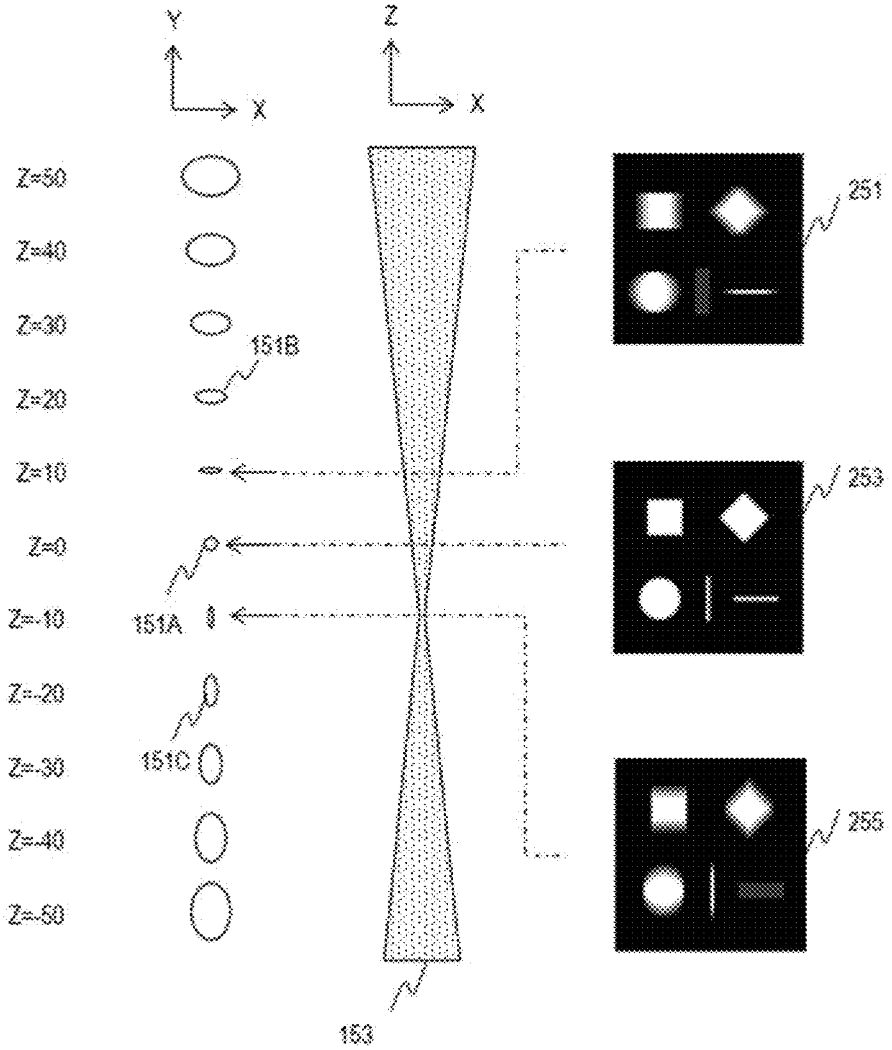

[FIG. 8]
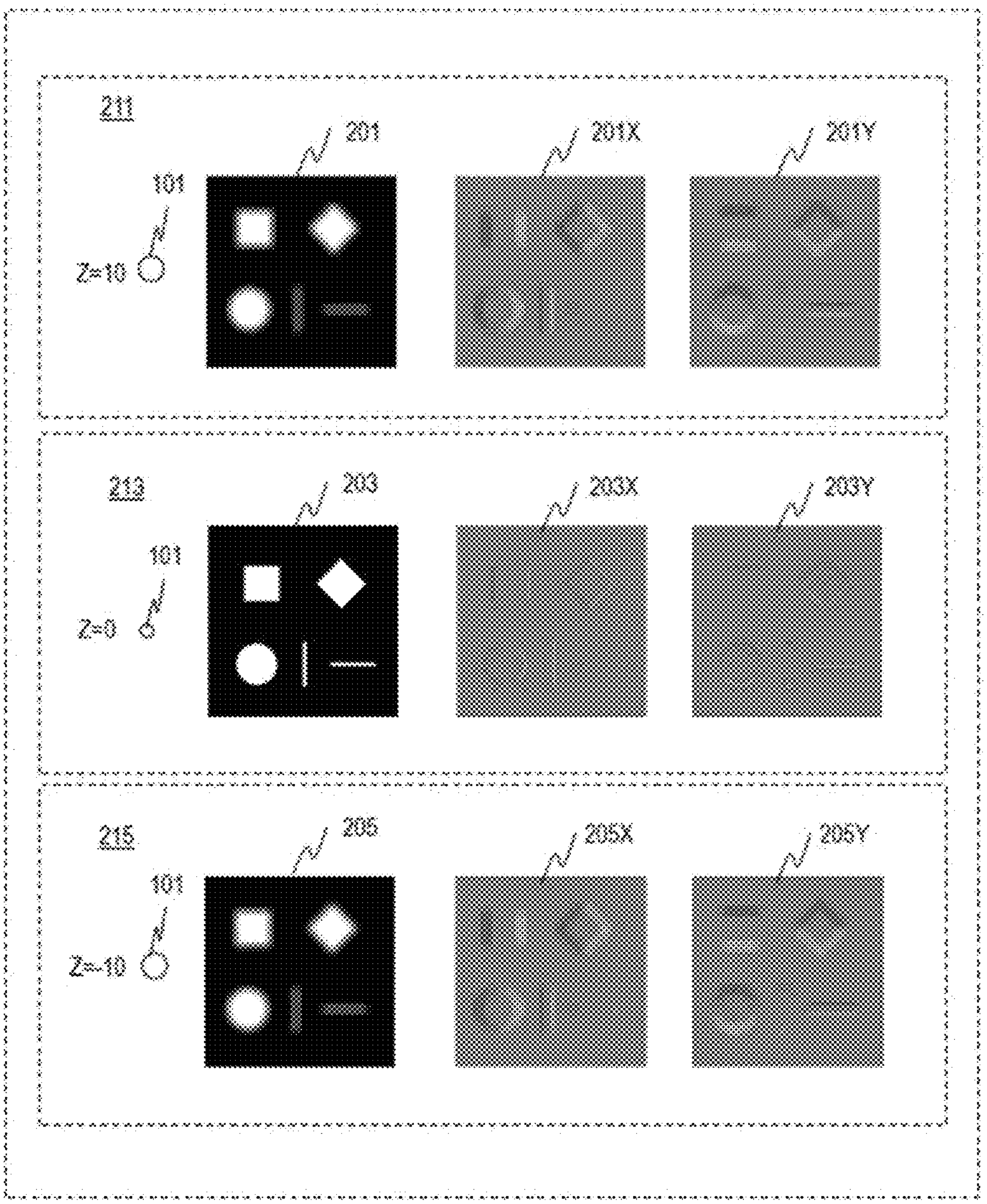

[FIG. 9]
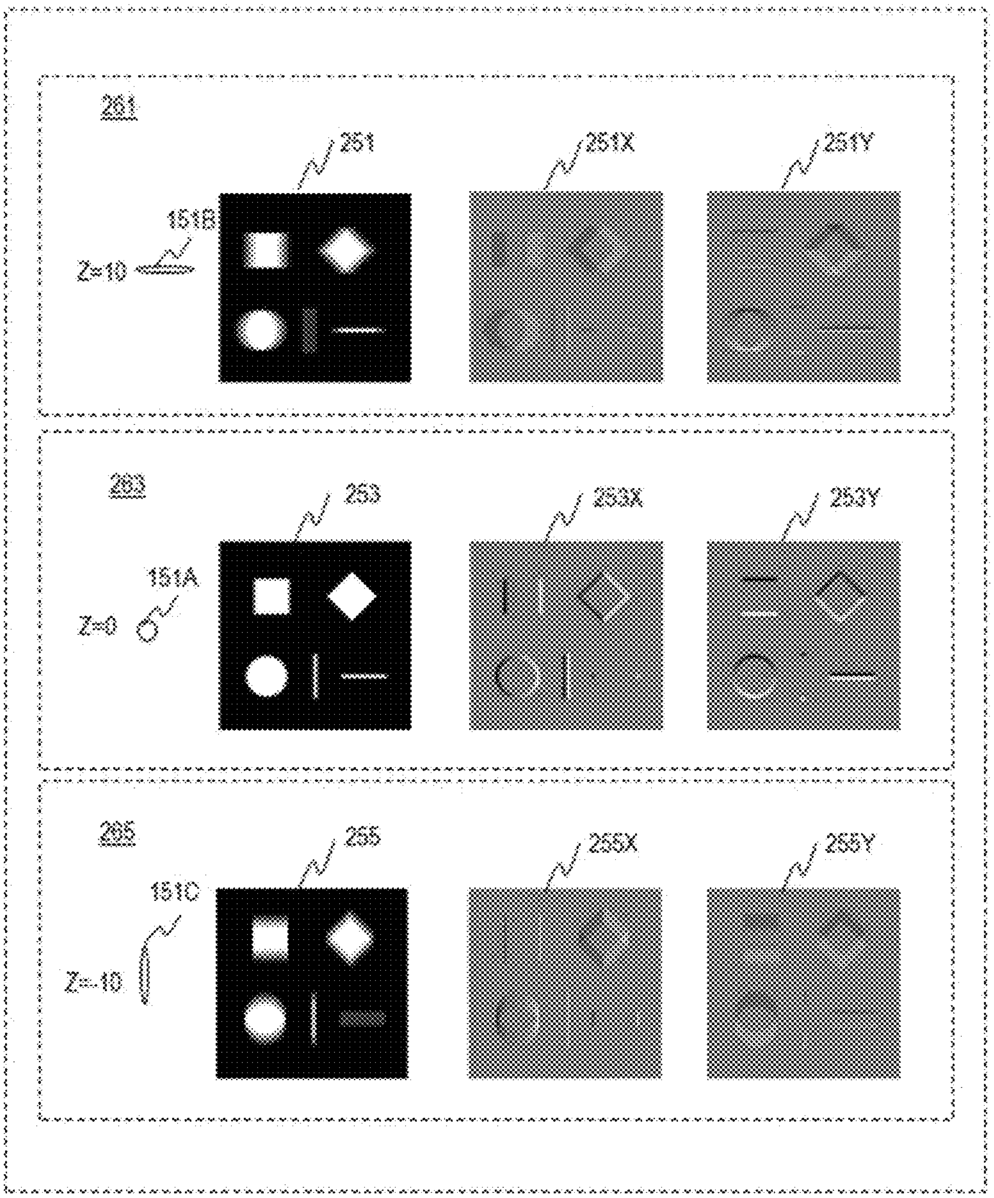

[FIG. 10]
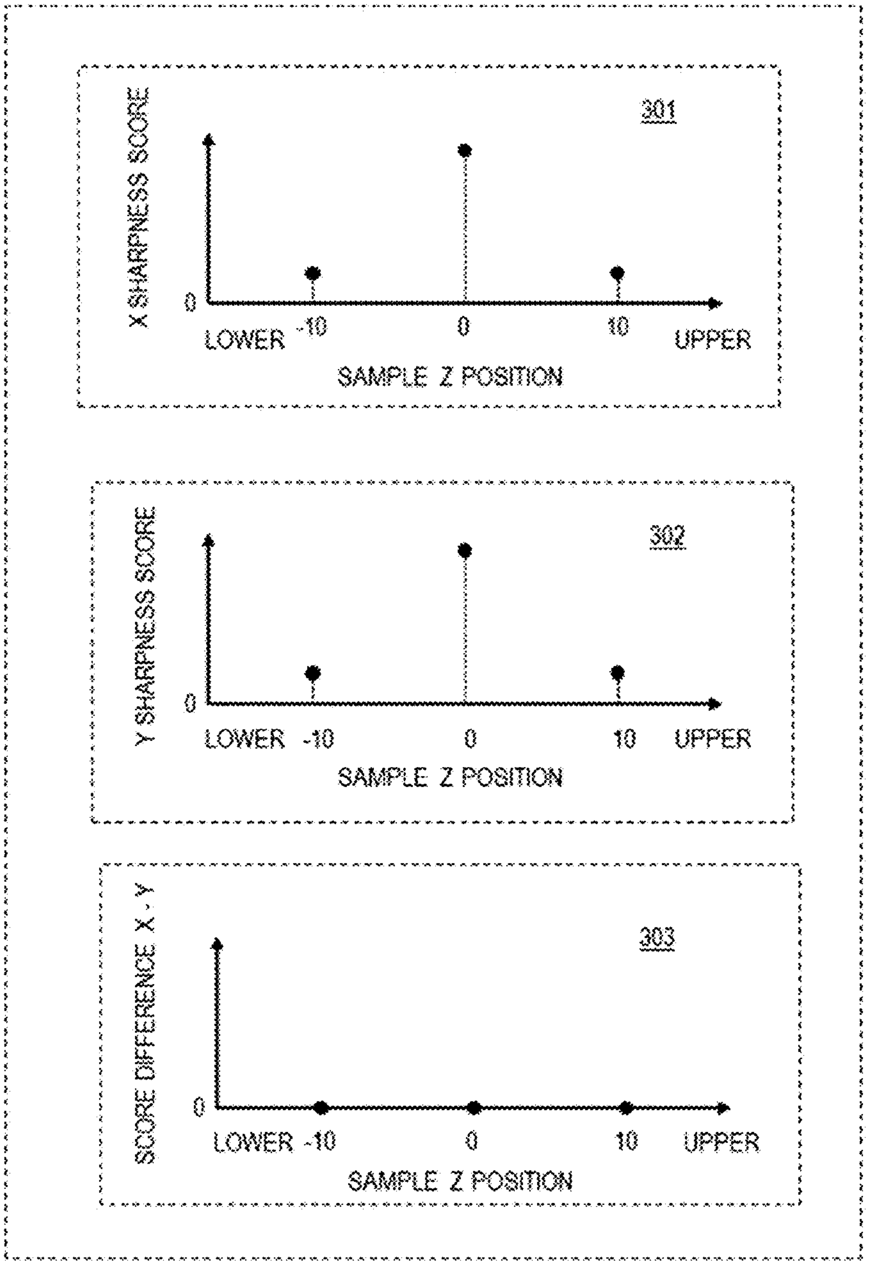

[FIG. 11]
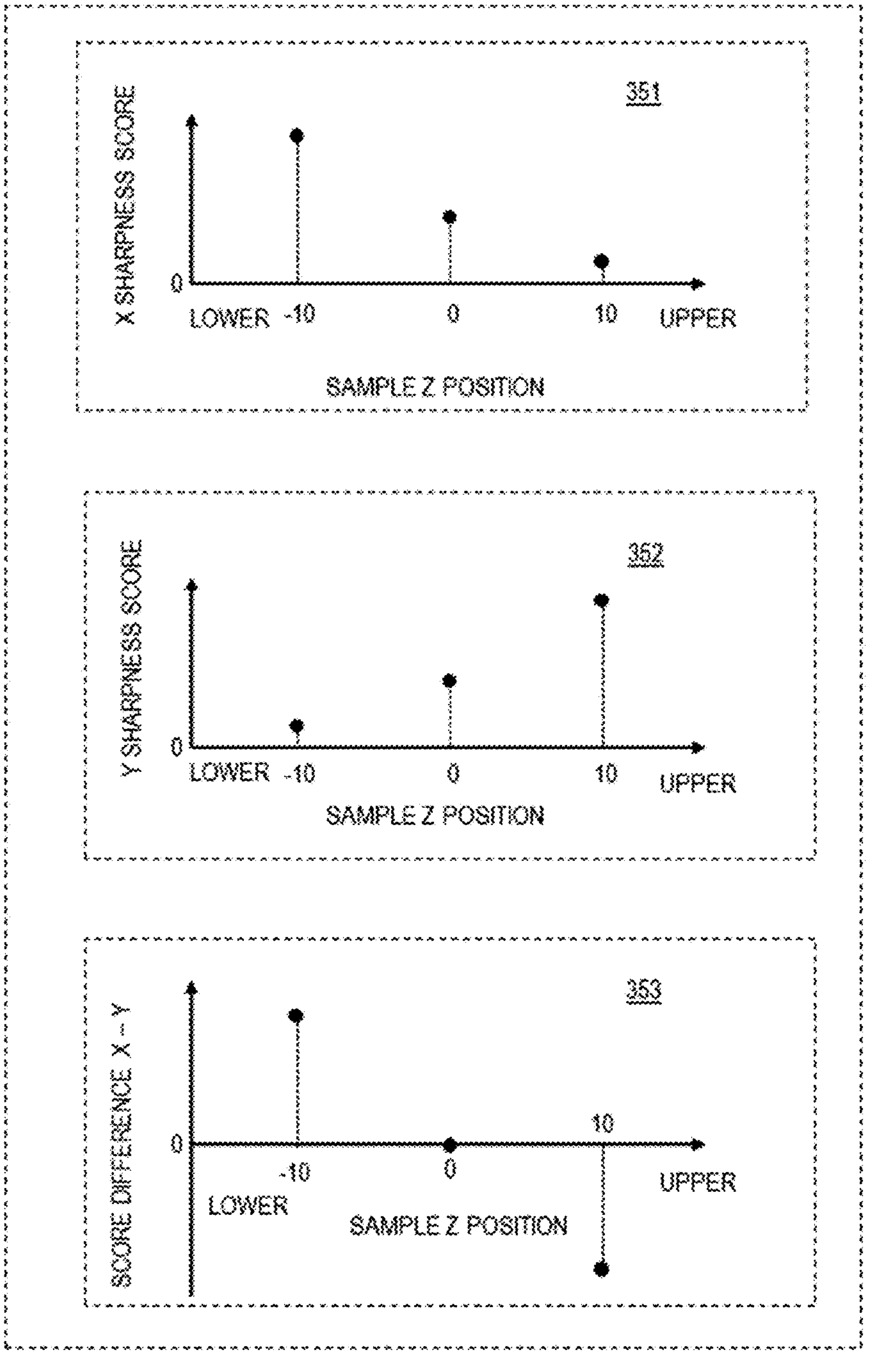

[FIG. 12]
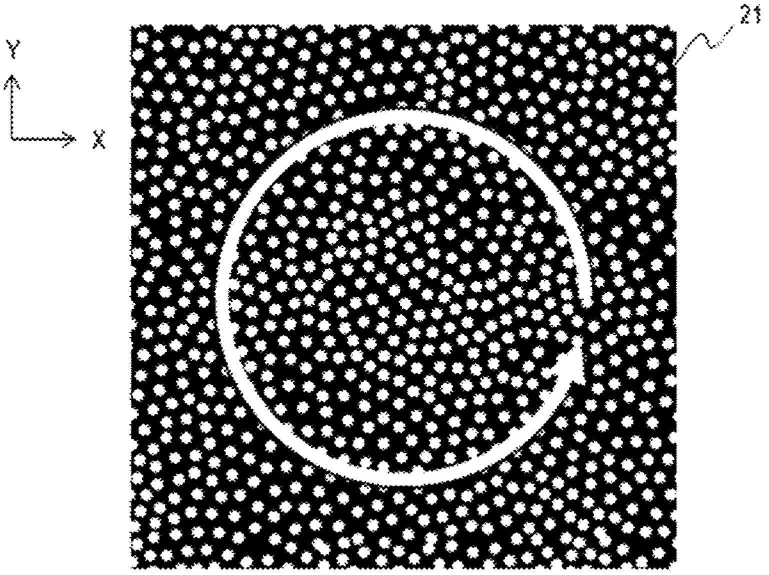
[FIG. 13]
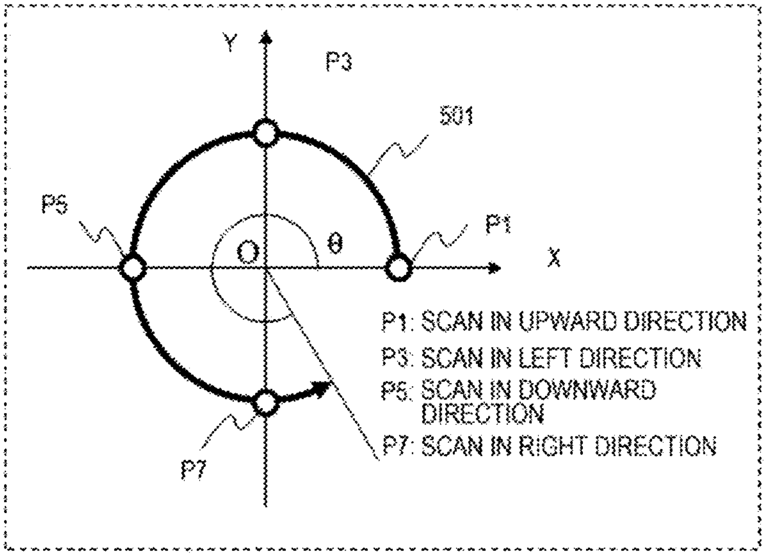

[FIG. 14]
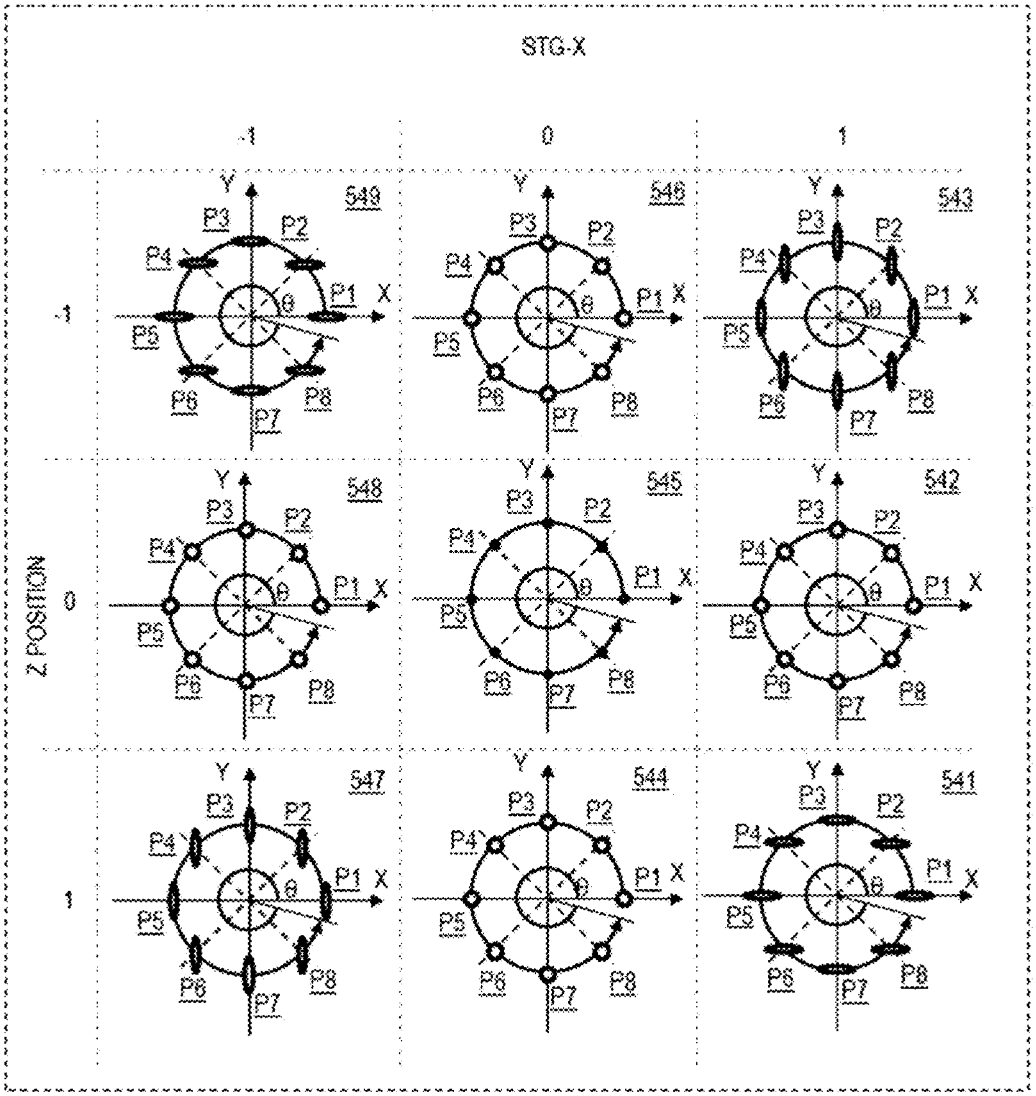

[FIG. 15]
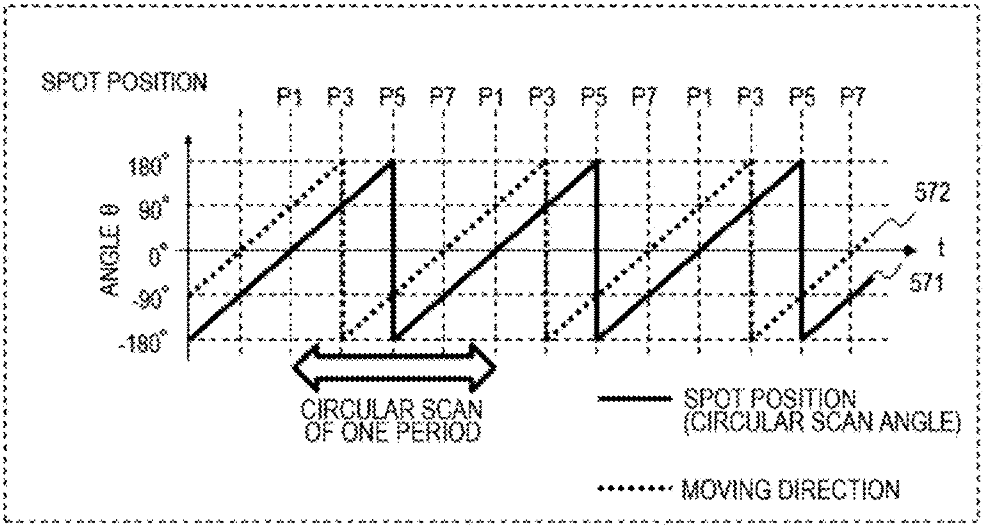
[FIG. 16]
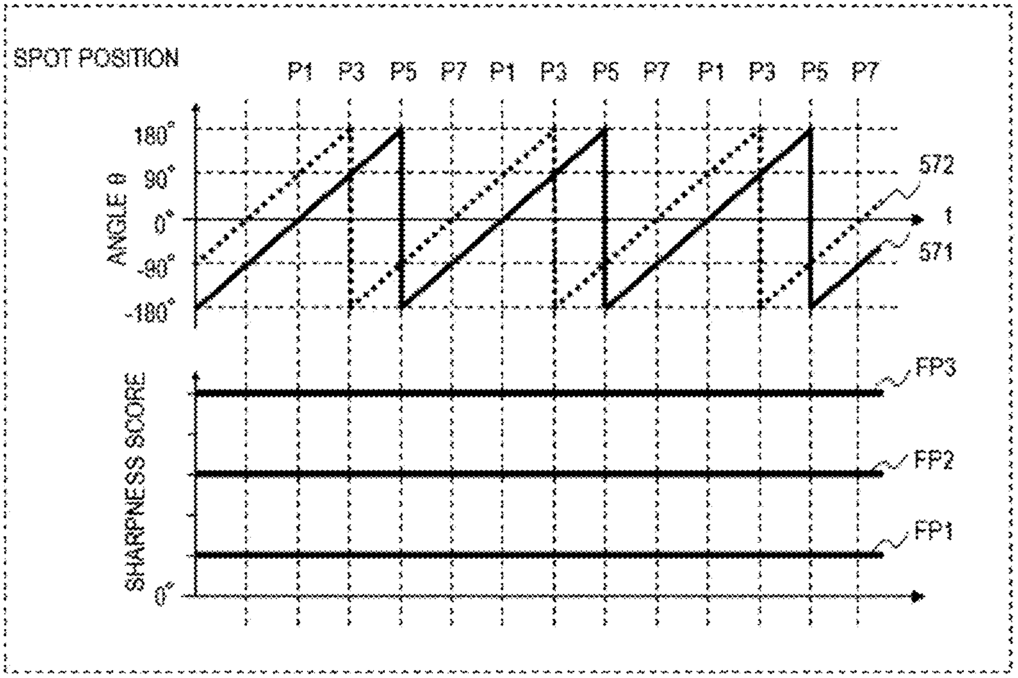

[FIG. 17]
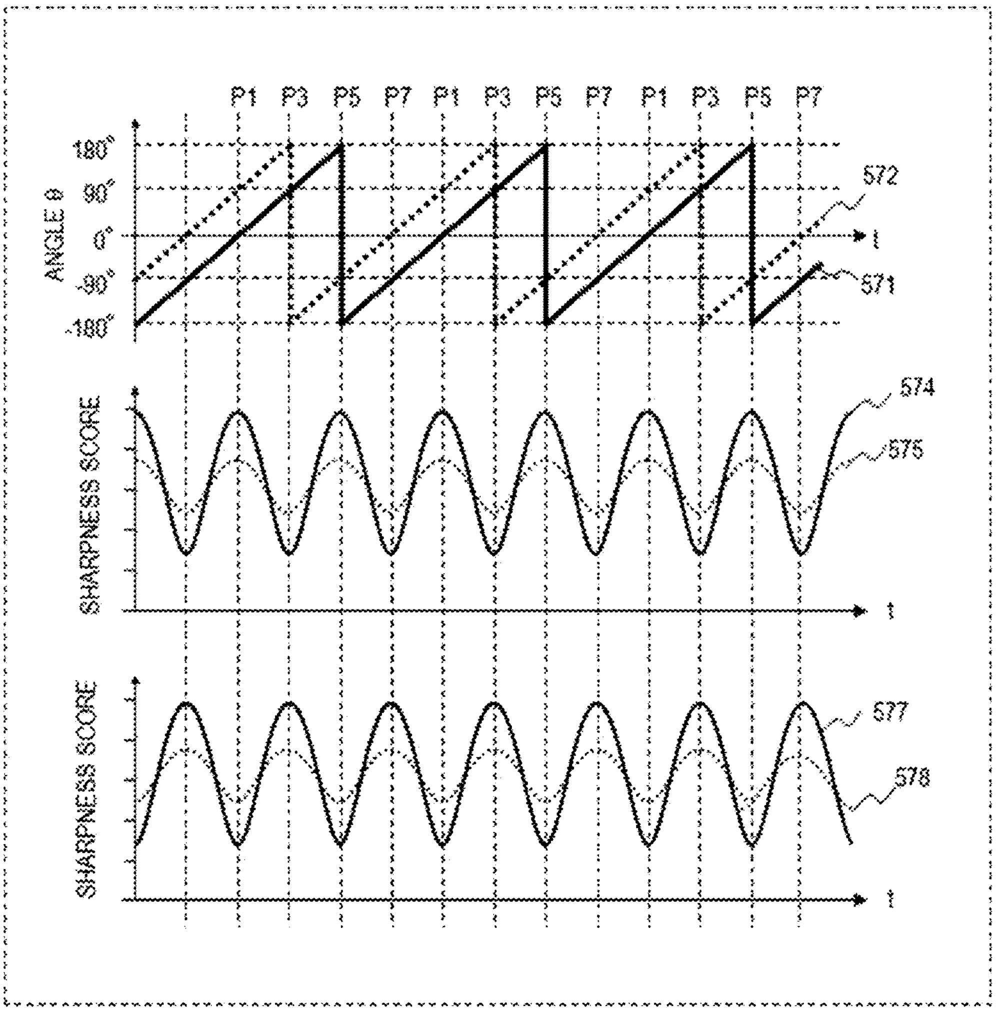

[FIG. 18]
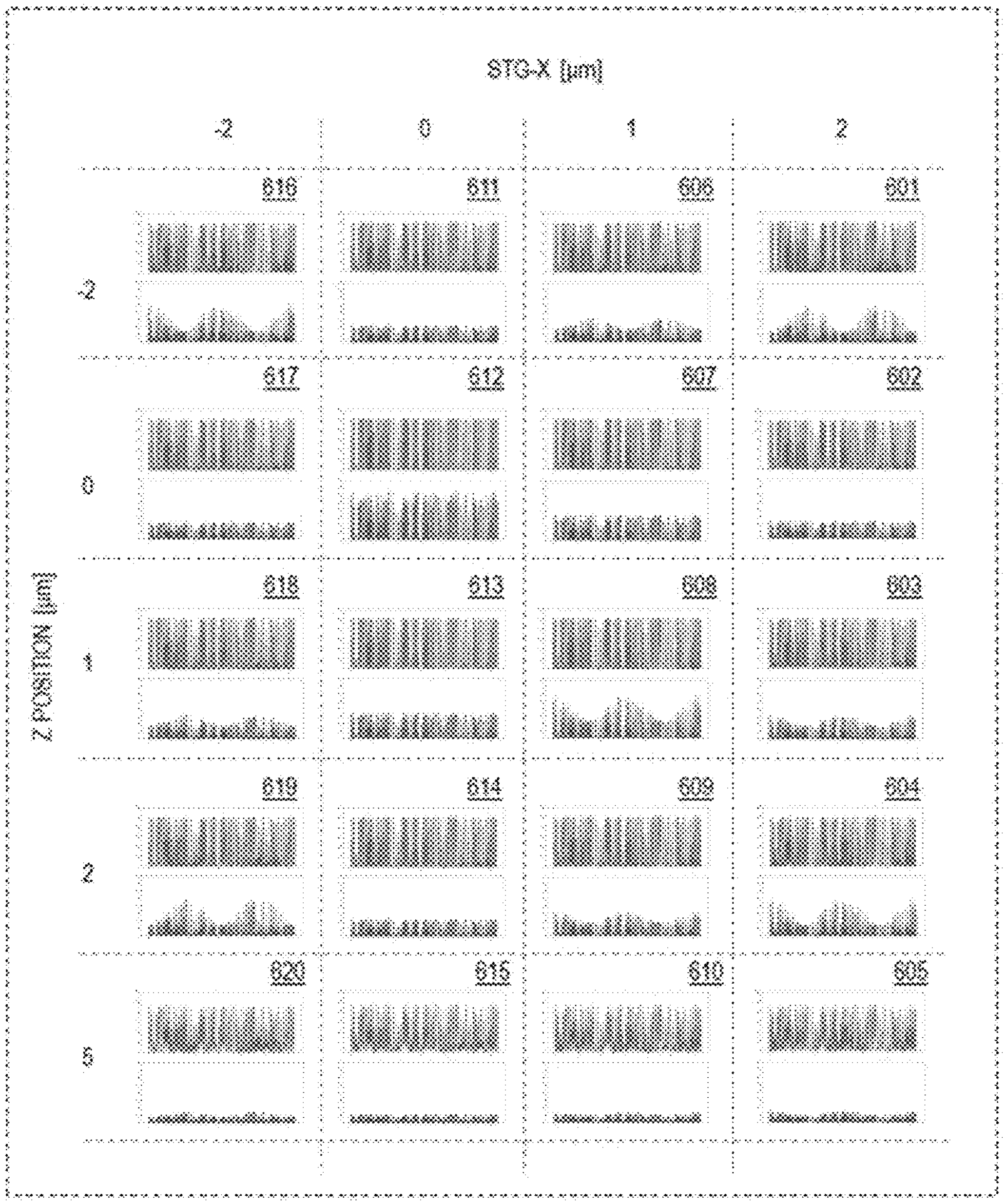

[FIG. 19]
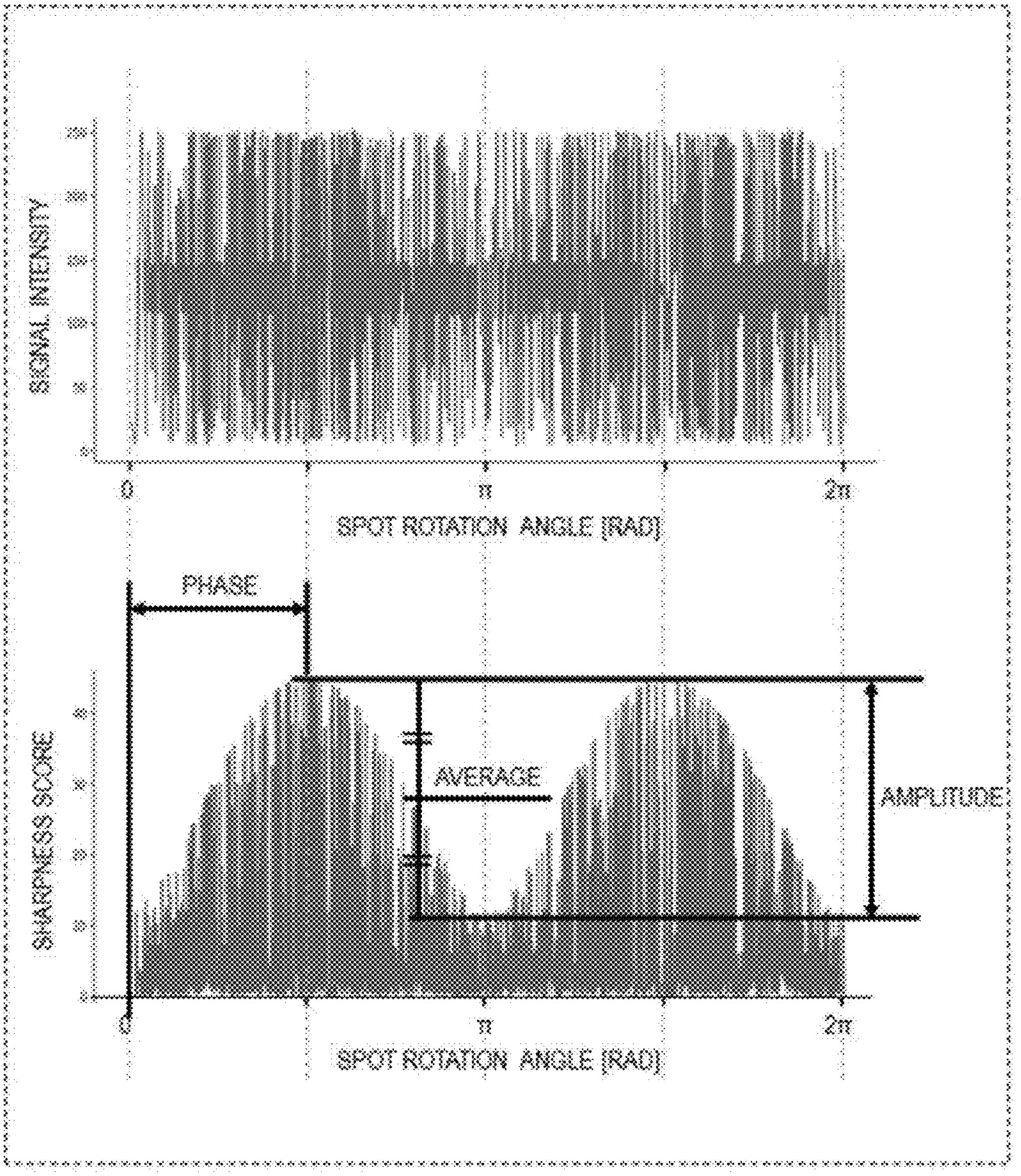

[FIG. 20]
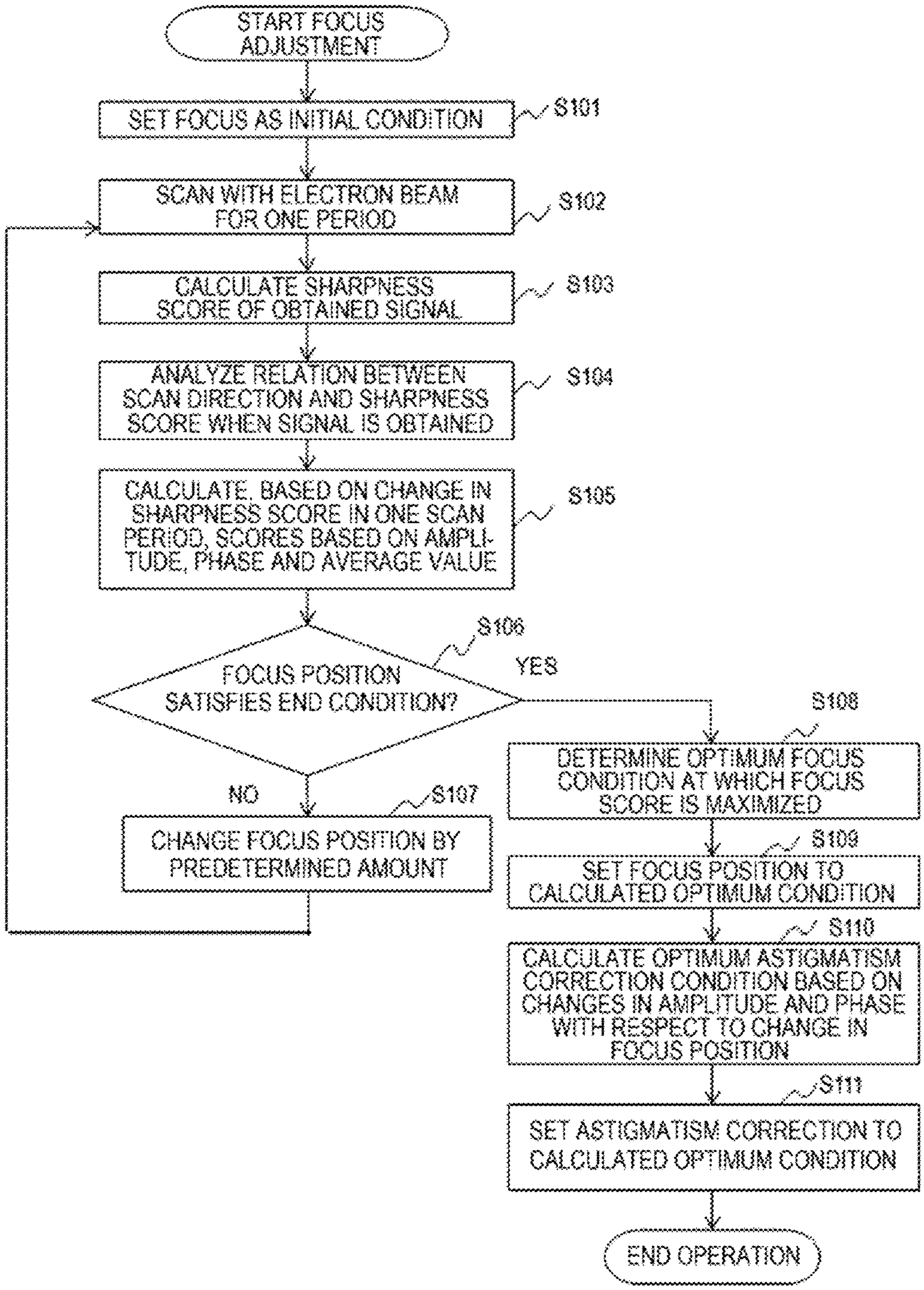

[FIG. 21]
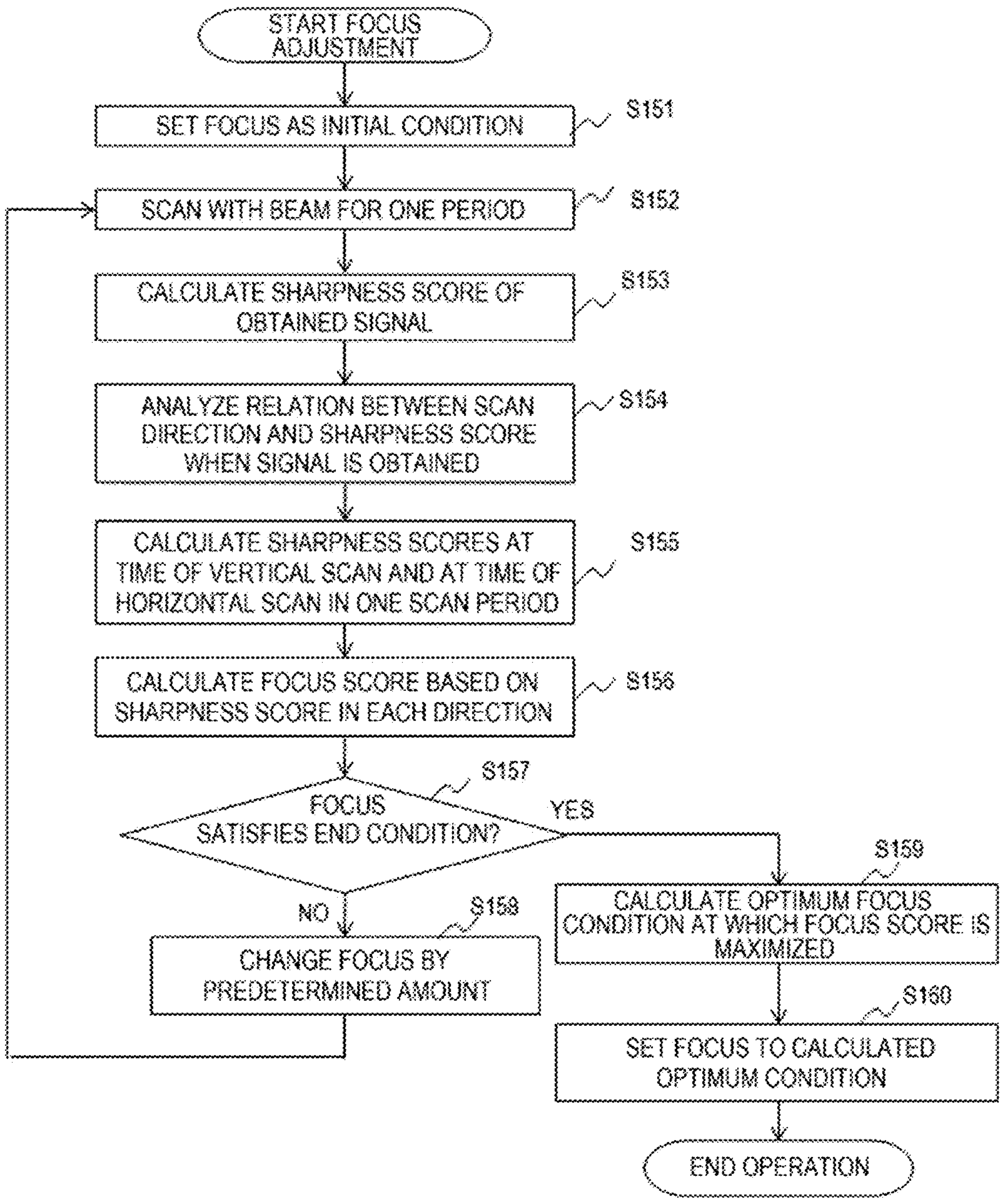

[FIG. 22]
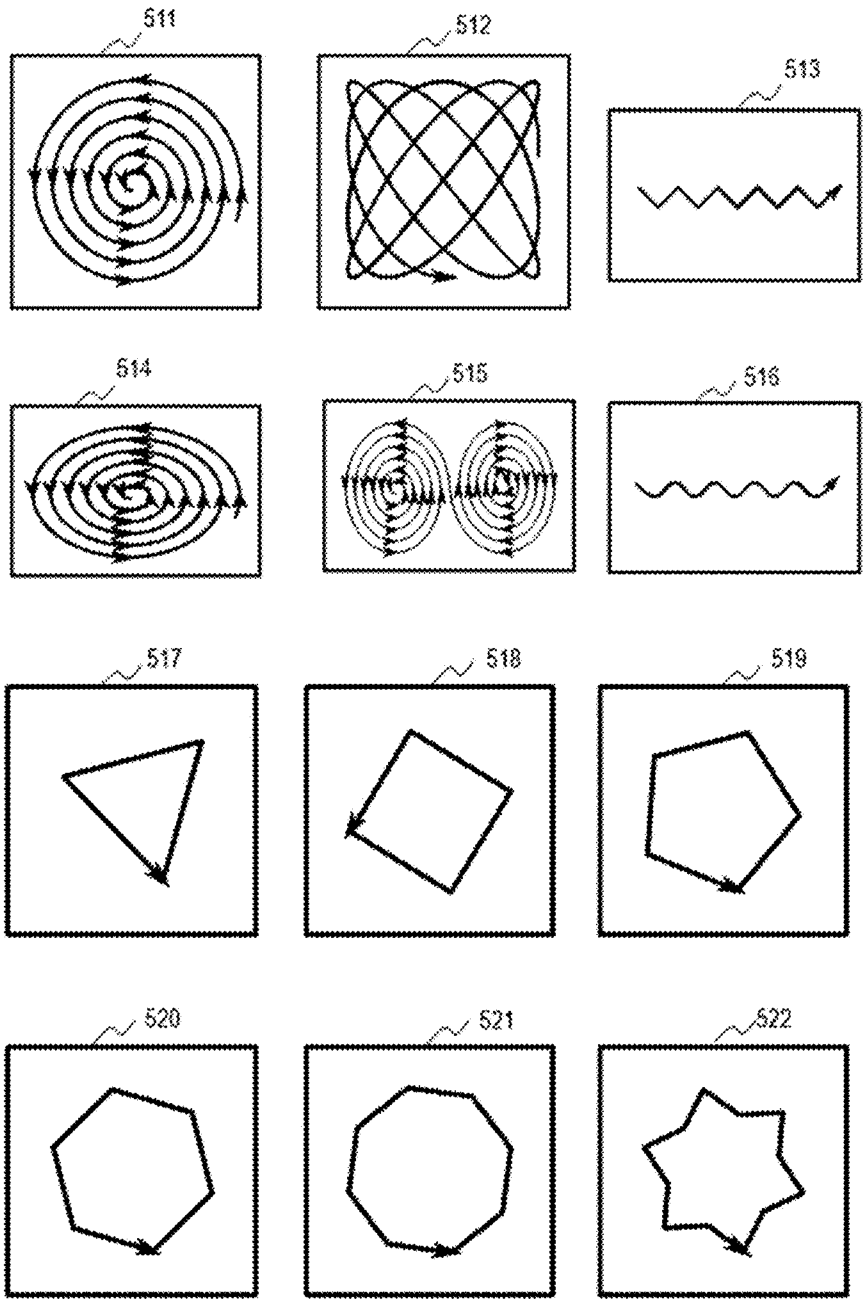

[FIG. 23]
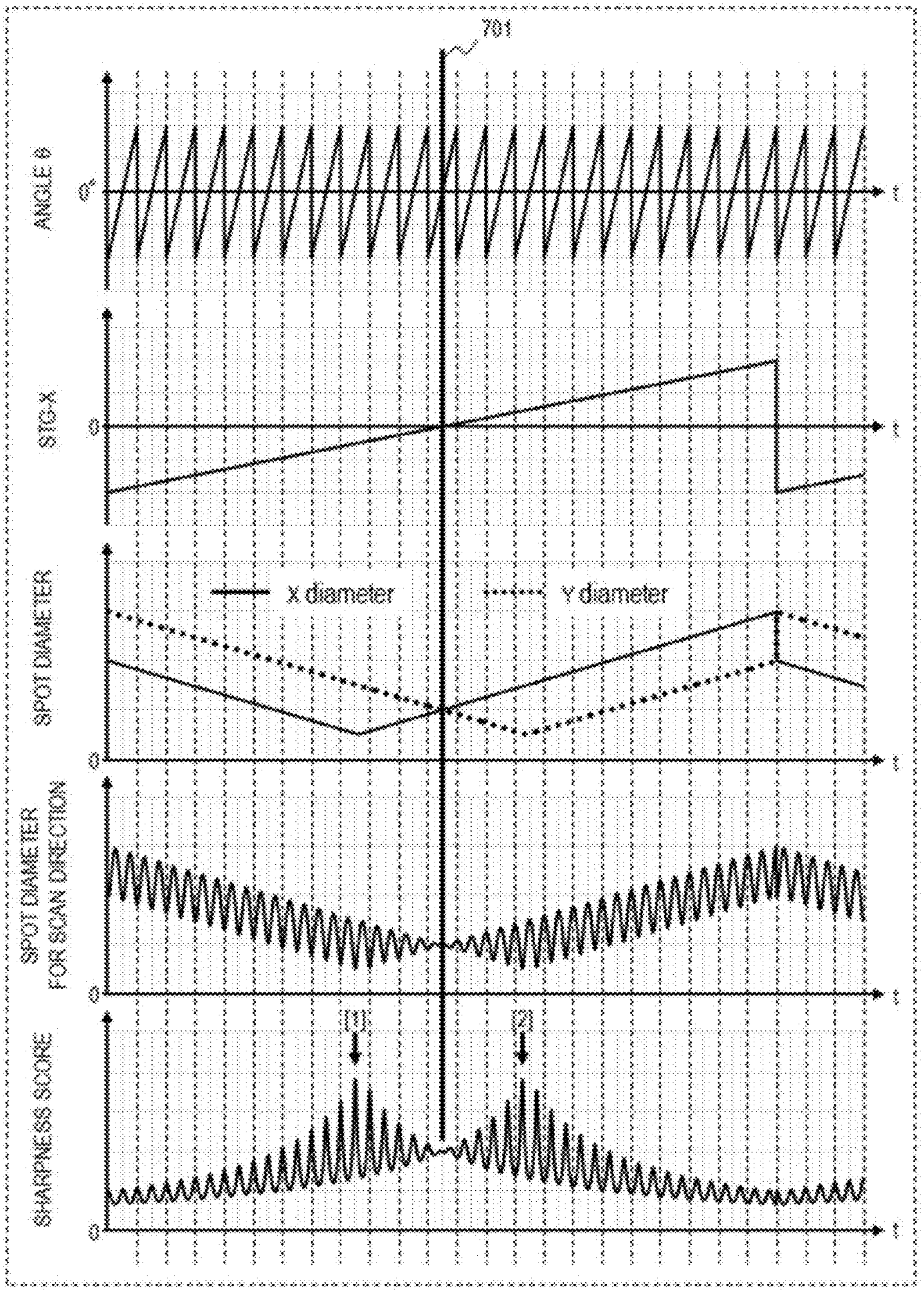

[FIG. 24]
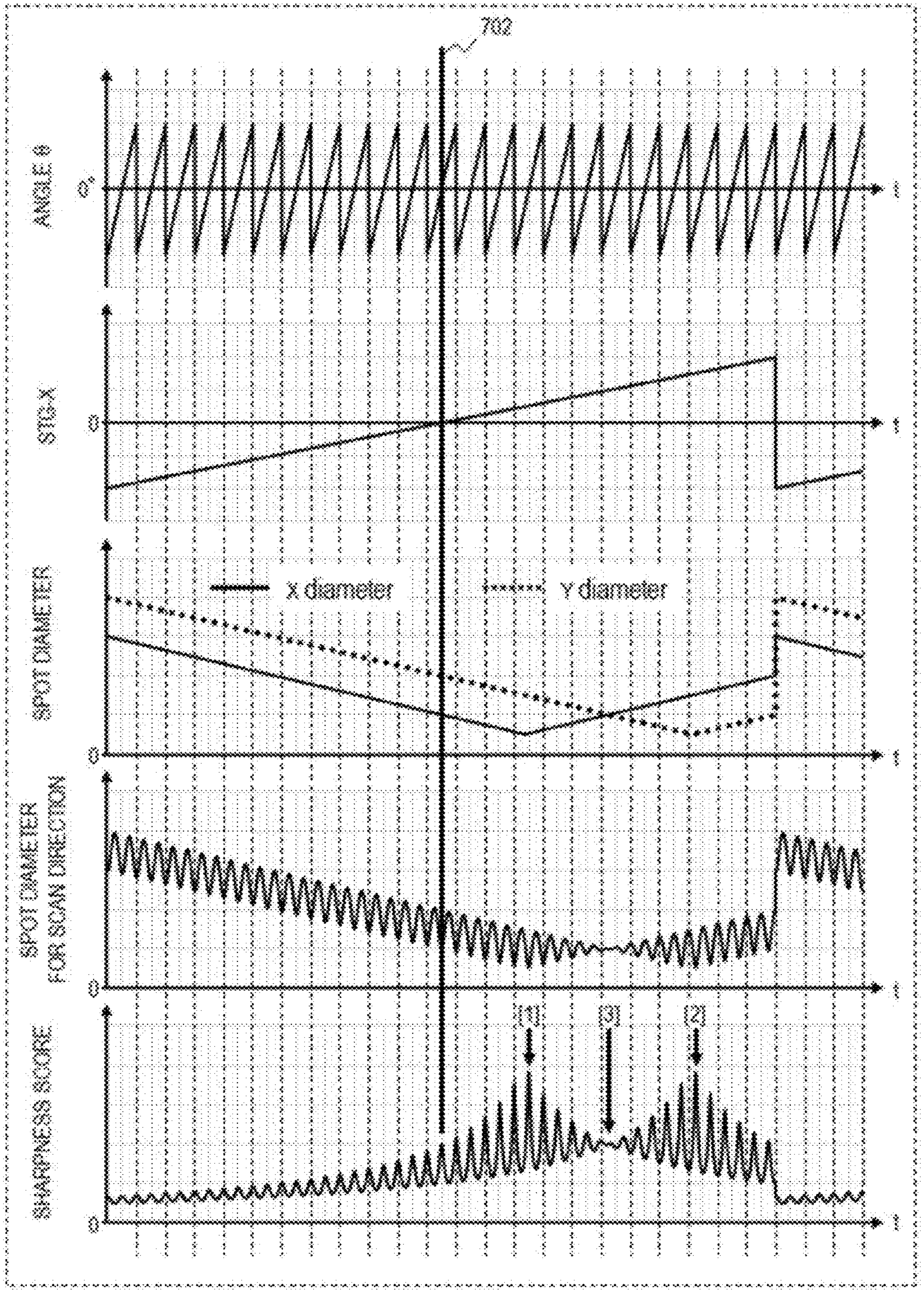

CHARGED PARTICLE BEAM SYSTEM

TECHNICAL FIELD

The present disclosure relates to a charged particle beam system.

BACKGROUND ART

For example, JP-A-2003-016983 (PTL 1) is a background art of the present application. JP-A-2003-016983 discloses that "a small number of two-dimensional particle images acquired while changing a focus in two types of scan directions are subjected to image processing to detect a direction and a magnitude of an astigmatic difference and a focus offset, and the direction and the magnitude and the focus offset are collectively converted into two types of astigmatism correction amounts and a focus correction amount to execute correction, thereby implementing a high-speed and high-precision automatic astigmatism and focus adjustment. Further, the automatic astigmatism and focus adjustment with higher precision is implemented by correcting an error of the astigmatic difference. Furthermore, a device that implements high-precision inspection and measurement over a long period of time using the automatic astigmatism and focus adjustment is implemented" (see Abstract).

CITATION LIST

Patent Literature

[PTL 1]: JP-A-2003-016983

SUMMARY OF INVENTION

Technical Problem

According to the technique in PTL 1, it is possible to automatically adjust focus and astigmatism in a charged particle beam device. However, in the technique in PTL 1, it is necessary to acquire the two-dimensional particle images and execute image processing thereof. In the field of utilizing the charged particle beam device, a technique capable of adjusting the focus and the astigmatism at higher speed is desired.

Solution to Problem

A charged particle beam system according to an aspect of the present disclosure includes: a charged particle beam device configured to emit a charged particle beam from a charged particle source to a sample via a charged particle optical system; and a control system configured to control the charged particle beam device. The control system scans the sample with the charged particle beam in a manner of forming a scan trajectory and determines scores of signal intensities associated with different scan directions in the scan trajectory, and generates, based on a relation between the scores and the different scan directions, information on at least one of a focus deviation and an aberration of the charged particle optical system.

Advantageous Effects of Invention

According to an aspect of the present disclosure, in the charged particle beam device, at least one of focus and astigmatism can be adjusted at higher speed.

BRIEF DESCRIPTION OF DRAWINGS

FIG. 1 schematically shows a basic configuration of a scanning electron microscope system.

FIG. 2 schematically shows a basic configuration of a scanning transmission electron microscope system.

FIG. 3 shows an example of a hardware configuration of a computer.

FIG. 4 shows a configuration example of an astigmatism correction device.

FIG. 5 shows an example of a change in a cross-sectional shape of an electron beam with respect to a change in a direction and a magnitude of astigmatism of an electron optical system.

FIG. 6 schematically shows a shape of an electron beam generated by an electron optical system having no astigmatism and images of a sample at different height positions obtained by the electron beam.

FIG. 7 schematically shows a shape of an electron beam generated by an electron optical system having predetermined astigmatism and images of a sample at different height positions obtained by the electron beam.

FIG. 8 shows a differential image of each of the images obtained by the electron optical system having no astigmatism.

FIG. 9 shows a differential image of each of the images obtained by the electron optical system having astigmatism.

FIG. 10 shows a sharpness score of an image in the electron optical system having no astigmatism.

FIG. 11 shows a sharpness score of an image in the electron optical system having astigmatism.

FIG. 12 shows an example of a scan trajectory of an electron beam (spot) on a sample.

FIG. 13 shows electron beam scan directions at several different positions of a circular scan trajectory shown in FIG. 12.

FIG. 14 shows movements of an electron beam (spot) on a sample and beam cross-sectional shapes at different positions in a scan trajectory in different combinations (states) of astigmatism and a position (also referred to as a Z position) on a Z axis of a sample surface.

FIG. 15 shows a relation between a spot position of the electron beam and a scan direction according to a circular scan shown in FIG. 14.

FIG. 16 shows temporal changes in a spot position and a scan direction and a temporal change in a sharpness score at a plurality of Z positions due to a circular scan in an optical system in which astigmatism is corrected.

FIG. 17 shows temporal changes in a spot position and a scan direction and a temporal change in a sharpness score due to a circular scan in an optical system having astigmatism of 0°.

FIG. 18 shows a temporal change in a signal intensity obtained in one period of a circular scan and a temporal change in a sharpness score (an absolute value of a differential value of the signal intensity) in different combinations (states) of astigmatism and a Z position of a sample.

FIG. 19 shows a change in a signal intensity with respect to a spot position due to a circular scan and a change in a sharpness score according to the change in the signal intensity.

FIG. 20 is a flowchart showing an example of an automatic focus adjustment and an automatic astigmatism correction that are executed by a control system.

FIG. 21 shows a flowchart of an automatic focus adjustment executed by the control system.

FIG. 22 shows an example of a scan trajectory of an electron beam (spot) on a sample.

FIG. 23 shows changes in a spot diameter and a sharpness score in orthogonal scan directions (a direction along an X axis and a direction along a Y axis) when an astigmatism amount is changed.

FIG. 24 shows an example of adjusting astigmatism of an optical system by combining a circular scan and a change in the astigmatism.

DESCRIPTION OF EMBODIMENTS

Hereinafter, examples will be described with reference to the accompanying drawings. It should be noted that the examples are merely examples for implementing the present disclosure and do not limit the technical scope of the present disclosure. In the drawings, the same components are denoted by the same reference numerals. Hereinafter, a sample observation device (electron microscope) using an electron beam will be described as an example of a charged particle beam device that emits a charged particle beam to a sample, and the features of the present disclosure can also be applied to a measurement device or an inspection device in addition to a device using an ion beam.

Hereinafter, a method for generating information for correcting at least one of a focus deviation and astigmatism of a charged particle beam will be described. In this method, a sample is scanned with a charged particle beam so as to form a one-dimensional scan trajectory, and scores of signal intensities associated with different scan directions in the scan trajectory are determined. Information for correcting at least one of the focus deviation and the astigmatism of the charged particle beam is generated based on a relation between the scores and the scan directions. In this way, by referring to the relation between the scan direction in the one-dimensional scan trajectory and the score, it is possible to quickly generate the information for correcting a basic focus deviation or the astigmatism.

FIG. 1 schematically shows a basic configuration of a scanning electron microscope (SEM) system. The SEM system includes an SEM device 50 and a control system 42. The SEM device 50 is an example of the charged particle beam device, and includes an electron beam source 1, an extraction electrode 2, a condenser lens 11, a condenser diaphragm 12, an axis adjustment deflector 13, an astigmatism correction device 14, a scan deflector 15, and an objective lens 20. In FIG. 1, only one condenser lens is indicated by a reference numeral 11 as an example.

The astigmatism correction device 14 may be a device implemented by combining coils, a device implemented by a multipole, a spherical surface implemented by combining a plurality of multipoles, or a device that executes various types of aberration corrections. In addition, each of the deflectors can be used for a predetermined purpose by combining a plurality of deflectors disposed at different heights.

The electron beam source 1 is an example of a charged particle source, and generates a primary electron beam. The condenser lens 11 adjusts a convergence condition of the primary electron beam. The condenser diaphragm 12 controls a spread angle of the primary electron beam. The axis adjustment deflector 13 adjusts a position of the primary electron beam with respect to the objective lens 20. The astigmatism correction device 14 adjusts a beam shape of the primary electron beam (probe) incident on a sample 21. The scan deflector 15 raster-scans the sample 21 with the primary electron beam incident on the sample 21. The objective lens 20 adjusts a focus position of the primary electron beam with respect to the sample 21.

The SEM device 50 further includes a sample stage 22, a reflection plate 16, and detectors 26. The sample stage 22 determines a position of the sample 21 in a sample chamber. Electrons generated from the sample 21 or electrons (also referred to as signal electrons) generated by collision of electrons from the sample 21 toward the reflection plate 16 are detected by the detector 26.

The control system 42 controls the SEM device 50. For example, the control system 42 controls an acceleration voltage or an extraction voltage of the primary electron beam, and currents of components such as the lens and the deflector. By controlling the sample stage 22, the control system 42 can adjust a positional relation of the sample 21 with respect to an emitting position of the primary electron beam with respect to the sample 21 and the focus position of the primary electron beam. The control system 42 controls a gain and an offset of the detector 26 and generates an image based on detected signal electrons.

The control system 42 includes a control device 40 and a computer 41. The computer 41 controls the components of the SEM device 50 via the control device 40. The computer 41 includes a storage device that stores programs and data used by the programs, and a processor that operates according to the programs stored in the storage device. The programs include a control program for the SEM device 50 and an image processing program.

The computer 41 further includes an interface and a user interface for connecting to a network. The user interface includes a display device that displays an image and an input device for a user to give an instruction to the computer 41. The computer 41 controls the control device 40. The control device 40 includes components such as an AD converter, a DA converter, a memory, and an arithmetic device such as an FPGA or a microprocessor.

A process of obtaining an SEM image will be described. The extraction electrode 2 extracts a primary electron beam from the electron beam source 1 at a predetermined extraction voltage. A direction parallel to an optical axis is defined as a Z direction, and a plane orthogonal to the optical axis is defined as an XY plane. The control system 42 aligns the primary electron beam so as to converge the primary electron beam on the sample 21 by adjusting a Z position of the sample stage 22 or adjusting a control parameter of the objective lens 20. This adjustment is a rough adjustment.

After the rough focus adjustment, the control system 42 selects a field of view for adjusting an electron optical system using an XY moving mechanism of the sample stage 22. At this time, the selection of the field of view may be executed by a user of the device directly operating the XY moving mechanism of the sample stage 22. The control system 42 corrects an axial deviation, a focus, and astigmatism in the field of view for adjusting an electron optical system. Specifically, the control system 42 corrects adjustment parameters of the axis adjustment deflector 13, the astigmatism correction device 14, and the objective lens 20.

Next, the control system 42 moves an observation field of view to a field of view for imaging using the sample stage 22, and acquires an image after a focus of the objective lens 20 is finely adjusted by a user operation such that a sharp image can be observed, or at an appropriate focus position adjusted by a focus adjustment function.

FIG. 2 schematically shows a basic configuration of a system used as a scanning transmission electron microscope (STEM). The STEM system includes an STEM device 51 and the control system 42. The STEM device 51 includes the electron beam source 1, the extraction electrode 2, the condenser lens 11, the condenser diaphragm 12, the axis adjustment deflector 13, the astigmatism correction device 14, the scan deflector 15, the objective lens 20, and the sample stage 22. In FIG. 2, only one condenser lens is indicated by the reference numeral 11 as an example. These functions are the same as those of the SEM device 50.

The STEM device 51 includes an objective diaphragm 23, an axis adjustment deflector 24, a selected area diaphragm 25, an imaging system lens 30, and a detector 31 on a rear side of the sample 21. In FIG. 2, only one imaging system lens is indicated by a reference numeral 30 as an example, and the imaging system lens is not necessarily required to obtain the function as STEM. The imaging system lens 30 forms an image of a transmitted electron beam transmitted through the sample 21. The detector 31 detects the electron beam formed as an image.

The control system 42 generates an image based on detected signal electrons. The control system 42 includes the control device 40 and the computer 41 as the SEM system. The programs executed by the computer 41 include a control program for the STEM device 51 and an image processing program.

A process of obtaining an STEM image will be described. The extraction electrode 2 extracts a primary electron beam from the electron beam source 1 at a predetermined extraction voltage. The control system 42 emits the primary electron beam to the sample 21 on the sample stage 22.

The control system 42 executes a rough focus adjustment of the primary electron beam by adjusting the Z position of the sample stage 22 or adjusting the control parameter of the objective lens 20. Thereafter, the control system 42 selects a field of view for adjusting an electron optical system using the XY moving mechanism of the sample stage 22. The control system 42 corrects deviation, focus, and astigmatism of an optical system in the field of view for adjusting an electron optical system. Specifically, the control system 42 corrects the adjustment parameters of the axis adjustment deflector 13, the astigmatism correction device 14, and the objective lens 20.

Next, the control system 42 moves the observation field of view to the field of view for imaging using the sample stage 22, and captures an image after the focus of the objective lens 20 is finely adjusted by a user operation such that a sharp image can be observed, or after the focus position is adjusted to an appropriate focus position by a focus tracking function.

The control system 42 causes the primary electron beam to be incident on the sample 21 using the condenser lens 11, the axis adjustment deflector 13, and the astigmatism correction device 14. The control system 42 scans the primary electron beam by the scan deflector 15. When the primary electron beam is incident on the sample 21, most of electrons transmit through the sample 21. The imaging system lens 30 causes the transmitted electron beam to be incident on the detector 31 at an appropriate angle, and an STEM image is obtained. A magnification of the STEM image is set by a current for controlling the scan deflector 15.

FIG. 3 shows an example of a hardware configuration of the computer 41. The computer 41 includes a processor 411, a memory (main storage device) 412, an auxiliary storage device 413, an output device 414, an input device 415, and a communication interface (I/F) 417. The above components are connected to one another by a bus. The memory 412, the auxiliary storage device 413, or a combination thereof is a storage device and stores programs and data to be used by the processor 411.

The memory 412 is implemented by, for example, a semiconductor memory, and is mainly used to hold programs and data being executed. The processor 411 executes various types of processing according to the programs stored in the memory 412. Various functional units are implemented by the processor 411 operating according to the programs. The auxiliary storage device 413 is implemented by a large-capacity storage device such as a hard disk drive or a solid state drive, and is used to hold the programs and data for a long period of time.

The processor 411 can be implemented by a single processing unit or a plurality of processing units, and can include a single or a plurality of arithmetic units or a plurality of processing cores. The processor 411 can be implemented as one or a plurality of central processing units, a microprocessor, a microcomputer, a microcontroller, a digital signal processor, a state machine, a logic circuit, a graphic processing unit, a chip-on system, and/or any device that operates a signal based on a control instruction.

The programs and data stored in the auxiliary storage device 413 are loaded into the memory 412 at startup or when needed, and the processor 411 executes the programs. Accordingly, various types of processing of the computer 41 are executed.

The input device 415 is a hardware device for a user to input instructions, information, and the like to the computer 41. The output device 414 is a hardware device that presents various images for input and output, and is, for example, a display device or a printing device. The communication I/F 417 is an interface for connecting to a network.

Functions of the computer 41 can be implemented in a computer system that includes one or more computers including one or more processors and one or more storage devices including a non-transitory storage medium. The plurality of computers communicate with one another via a network. For example, a plurality of functions of the computer 41 may be implemented in the plurality of computers.

FIG. 4 shows a configuration example of the astigmatism correction device 14. In the configuration example in FIG. 4, the astigmatism correction device 14 includes an octupole coil. The astigmatism correction device 14 includes coils (X-axis astigmatism correction coils) X11, X12, X21 and X22 that correct astigmatism of an X axis pair (X1 and X2), and coils (Y-axis astigmatism correction coils) Y11, Y12, Y21, and Y22 that correct astigmatism of a Y axis pair (Y1 and Y2).

The X-axis astigmatism correction coil is disposed at a position rotated by 4.5 degrees about a center of the optical axis with respect to an arrangement position of the Y-axis astigmatism correction coil. The X-axis astigmatism correction coils X11 and X12 face each other across the center of the optical axis. The X-axis astigmatism correction coils X21 and X22 face each other across the center of the optical axis. The Y-axis astigmatism correction coils Y11 and Y12 face each other across the center of the optical axis. The Y-axis astigmatism correction coils Y21 and Y22 face each other across the center of the optical axis. An intersection of the X1 axis, the X2 axis, the Y1 axis, and the Y2 axis preferably coincides with the center of the optical axis.

The astigmatism correction device 14 uses the octupole coil to deform a cross-sectional shape of a primary electron beam EB (hereinafter, simply referred to as an electron beam). Since a direction of a magnetic field generated by the coil and a direction of a force applied by the magnetic field to the primary electron beam are orthogonal to each other, the beam can be deformed in the Y axis (Y1, Y2) direction using the X-axis astigmatism correction coil, and the beam can be deformed in the X axis (X1, X2) direction using the Y-axis astigmatism correction coil. For example, FIG. 4 shows the electron beam EB deformed in a manner of being pulled from the center of the optical axis in both positive and negative directions of the X1 axis. The Y-axis astigmatism correction coil is used for correcting astigmatism of the electron beam EB deformed into such a shape.

The control system 42 causes a current to flow through the Y-axis astigmatism correction coils Y11 and Y12 to generate a magnetic flux flow along the Y1 axis in the optical axis direction, and at the same time, causes a current in an opposite direction to flow through the Y-axis astigmatism correction coils Y21 and Y22 to generate a magnetic field in the Y2 axis in a direction opposite to the Y1 axis. As a result, in the X1 axis, a magnetic field is generated in a direction orthogonal to the X1 axis and in directions from Y11 to Y21 and from Y12 to Y21, so that the electron beam EB is deformed in a direction in which the electron beam EB is compressed along a long axis direction (X1 axis) of ellipse. In the X2 axis, a magnetic field is generated in a direction orthogonal to the X2 axis and in directions from Y12 to Y21 and from Y11 to Y22, so that the electron beam EB is deformed in a direction in which the electron beam EB diverges along a long axis direction (X2 axis) of ellipse. As a result, the electron beam EB passed through a correction magnetic field formed by the astigmatism correction coils is corrected into a circular shape.

When an electron beam that has an elliptical cross section having a long axis coinciding with the Y1 axis or the Y2 axis and a short axis coinciding with the Y2 axis or the Y1 axis, the control system 42 uses the X-axis astigmatism correction coils. Specifically, the control system 42 causes a current to flow through the X-axis astigmatism correction coils X11 and X12 to generate a magnetic flux flow in a direction toward the optical axis along the X1 axis or in a direction separated from the optical axis, and at the same time, causes a current in an opposite direction to flow through the X-axis astigmatism correction coils X21 and X22 to generate a magnetic field in the X2 axis in a direction opposite to the X1 axis. Accordingly, it is possible to correct the electron beam such that the electron beam has a circular cross section.

For example, the control system 42 specifies a current (X parameter) of the X-axis astigmatism correction coils and a current (Y parameter) of the Y-axis astigmatism correction coils to control the astigmatism correction device 14. The astigmatism correction device 14 applies a current to each of the correction coils according to the specified X and Y parameters.

Further, in the above description, an example of astigmatism correction using a coil is described. Alternatively, a same adjustment can be executed using an electrode instead of the coil and using an action attained by an electric field. In this case, the only difference from the case in which a magnetic field is used is that the electron beam is deformed with respect to a direction of a controlling electrode, and a same effect can be attained by executing a same control for the other points. In addition, in the above description, an example of astigmatism correction using an octupole coil has been described, and it is also possible to correct an aberration having different symmetry using a multipole coil having a different number such as a 12-pole coil.

FIG. 5 is an example showing how a cross-sectional shape of an electron beam on a surface at a same height changes when a direction and a magnitude of astigmatism of an electron optical system change. A cross section 121 to a cross section 125 show an example in which the direction of the astigmatism is 0° and the magnitude of the astigmatism changes. For example, this example corresponds to a case in which the cross section 123 has an astigmatism amount of 0, the cross section 122 has an astigmatism amount of 1, the cross section 121 has an astigmatism amount of 2, the cross section 124 has an astigmatism amount of −1, and the cross section 125 has an astigmatism amount of −2.

A cross section 131 to a cross section 135 show an example in which the direction of the astigmatism is 45° and the magnitude of the astigmatism changes. For example, this example corresponds to a case in which the cross section 133 has an astigmatism amount of 0, the cross section 132 has an astigmatism amount of 1, the cross section 131 has an astigmatism amount of 2, the cross section 134 has an astigmatism amount of −1, and the cross section 135 has an astigmatism amount of −2.

The unit of an amount of an aberration and a scale of an absolute amount of the aberration at this time can take various forms according to conditions and ways of taking a reference. As another method for expressing the aberration, when a magnitude of the aberration is expressed by a positive numerical value, the cross section 124 can also be expressed as an aberration corresponding to a magnitude 1 in the 90° direction, the cross section 125 can also be expressed as an aberration corresponding to a magnitude 2 in the 90° direction, the cross section 134 can also be expressed as an aberration corresponding to a magnitude 1 in the 135° direction, and the cross section 135 can also be expressed as an aberration corresponding to a magnitude 2 in the 135° direction.

In the case of first-order astigmatism, since the first-order astigmatism has rotational symmetry of 180°, an aberration in the 0° direction and an aberration in the 180° direction are substantially equal to each other. Based on this, it is also possible to treat an angle region in which a long axis direction of a beam cross section changes in a range of 0° to 180° as one period of a direction of an aberration, and to express the direction by newly assigning an angle of 0° to 360° or −180° to 180° to this one period. In addition, it is also possible to decompose an amount of an aberration having any direction and magnitude into components in two orthogonal directions and use a complex number expression in which the components are set as a real part and an imaginary part. A direction of such an aberration is also expressed as a phase.

FIG. 6 schematically shows a part where an electron beam converges by an electron optical system that has no astigmatism or has astigmatism in such a small amount that an influence thereof is negligible, and images obtained when observing a sample at different height positions by the electron beam.

In FIG. 6, a reference numeral 103 denotes a cross section of an electron beam having one convergence point with a Z axis as an optical axis on a plane including the Z axis and an X axis. Further, a reference numeral 101 and a plurality of circles shown on the upper side thereof indicate cross-sectional shapes of the electron beam in a plurality of different planes on the Z axis, and a horizontal direction and a vertical direction of the figure correspond to the X axis direction and a Y axis direction, respectively. A position on the Z axis corresponding to each cross-sectional shape 101 when a convergence position of the beam is set as a reference (Z=0) is shown on the left side, and the unit is, for example, μm. A position above a focus position is indicated by a positive number, and a position below the focus position is indicated by a negative number. The X axis, the Y axis, and the Z axis are perpendicular to one another.

Since an electron optical system of a charged particle beam device has no astigmatism, the beam cross-sectional shape 101 at any height position (position on the Z axis) is a circle. In FIG. 5, for example, the beam cross-sectional shape at one height position is indicated by the reference numeral 101. A diameter of the beam cross-sectional shape is the smallest at the focus position (Z=0), and increases as a distance from the focus position increases.

Therefore, an image 203 in which the height position of the sample coincides with the focus position (Z=0) of the electron beam 103 is the sharpest image. Both an image 201 in which the height position of the sample is above the focus position (Z=10) and an image 205 in which the height position of the sample is below the focus position (Z=−10) are blurred as compared to the image 203 at the focus position, and a sharpness thereof is low. At this time, since the electron optical system has no astigmatism, blurs of the images 201 and 205 are isotropic.

FIG. 7 schematically shows the shape of the electron beam shown in FIG. 6 in a state in which astigmatism is added to the electron optical system, and images of the sample at different height positions obtained by the electron beam. A reference numeral 153 denotes a cross section of the electron beam on the plane including the Z axis and the X axis. The optical axis of the electron beam coincides with the Z axis, and the X axis, the Y axis, and the Z axis are perpendicular to one another.

A value of Z shown on the left of FIG. 7 indicates the position on the Z axis, and the unit is, for example, μm. The position on the Z axis corresponding to each figure is shown on the left, and the unit is, for example, μm. The position on the Z axis shown in FIG. 6 and the position on the Z axis shown in FIG. 7 are the same. The horizontal direction and the vertical direction of the figure correspond to the X axis direction and the Y axis direction, respectively.

In FIG. 7, a beam cross-sectional shape 151A at a position where Z=0 is a circle. Since the electron optical system of the charged particle beam device has astigmatism, a diameter of the beam cross-sectional shape 151A at the position of Z=0 is larger than the diameter of the beam cross-sectional shape at the position of Z=0 of the electron optical system having no astigmatism. An image 253 in which the height position of the sample coincides with the position where Z=0 is slightly blurred as compared with the image 203 at the position where Z=0. The image 203 is obtained by the electron optical system having no astigmatism.

In the electron optical system having astigmatism, a beam cross-sectional shape at a position different from the position where Z=0 is different from a circle. The astigmatism shown in FIG. 7 is first-order astigmatism or two-fold symmetric astigmatism, and the beam cross-sectional shape at a height position different from the position where Z=0 is elliptical.

In FIG. 7, one beam cross-sectional shape at a position upper than the position at which Z=0 is indicated by a reference numeral 151B, and a long axis coincides with the X axis and a short axis coincides with the Y axis. One beam cross-sectional shape at a position lower than the position where Z=0 is indicated by a reference numeral 151C, and a long axis coincides with the Y axis and a short axis coincides with the X axis.

The beam cross-sectional shape has the smallest diameter on the Y axis at a height position where Z=10. As the height position is separated from the height position where Z=10, the diameter on the Y axis increases. The height position where Z=10 can be regarded as a focus position on the Y axis. The beam cross-sectional shape has the smallest diameter on the X axis at a height position where Z=−10. As the height position is separated from the height position where Z=−10, the diameter on the X axis increases. The height position where Z=−10 can be regarded as a focus position on the X axis.

Accordingly, it can be seen that in the electron optical system having no astigmatism, the beam cross-sectional shape is circular and isotropic near above and below the focus position, whereas in a state in which the optical system has astigmatism, the beam cross-sectional shape is anisotropic near above and below the focus position, and the direction thereof changes above and below the focus position.

As compared with the image 253 at the position where Z=0, an image 251 when the height position of the sample is Z=10 has a larger blur along the X axis and a smaller blur along the Y axis. Therefore, the sharpness along the X axis is low, and the sharpness along the Y axis is high. The sharpness indicates a degree of change in the signal intensity. This is because the diameter of the beam cross-sectional shape on the X axis at the height position where Z=10 is larger than the diameter at the position where Z=0, and the diameter of the beam cross-sectional shape on the Y axis at the height position where Z=10 is smaller than the diameter at the position where Z=0.

As compared with the image 253 at the position where Z=0, an image 255 when the height position of the sample is Z=−10 has a smaller blur along the X axis and a larger blur along the Y axis. Therefore, the sharpness along the X axis is high and the sharpness along the Y axis is low. This is because the diameter of the beam cross-sectional shape on the Y axis at the height position where Z=−10 is larger than the diameter at the position where Z=0, and the diameter of the beam cross-sectional shape on the X axis at the height position where Z=−10 is smaller than the diameter at the position where Z=0.

FIG. 8 shows differential images of the images 201, 203, and 205 obtained by the electron optical system having no astigmatism. An image group 211 includes the image 201 when the height position of the sample is Z=10, a differential image 201X along the X axis of the image 201, and a differential image 201Y along the Y axis of the image 201.

An image group 213 includes the image 203 when the height position of the sample is at the focus position (Z=0), a differential image 203X along the X axis of the image 203, and a differential image 203Y along the Y axis of the image 203. An image group 215 includes the image 205 when the height position of the sample is Z=−10, a differential image 205X along the X axis of the image 205, and a differential image 205Y along the Y axis of the image 205.

The differential image shows a change (sharpness) in an image intensity (luminance) along a corresponding axis, and the intensity (luminance) increases as a gradient of the intensity of an original image becomes steeper. In FIG. 8, the differential image 203X at the focus position shows a maximum intensity higher than that of the other differential images 201X and 205X along the X axis. The differential image 203Y at the focus position shows a maximum intensity higher than that of the other differential images 201Y and 205Y along the Y axis. This indicates that the diameters of the beam cross section along the X axis and the Y axis at the focus position are smaller than the diameters of the beam cross section along the X axis and the Y axis at the other height positions, and the obtained images are sharp in the directions of the X axis and the Y axis.

FIG. 9 shows differential images of the images 251, 253, and 255 obtained by the electron optical system having astigmatism. An image group 261 includes the image 251 when the height position of the sample is Z=10, a differential image 251X along the X axis of the image 251, and a differential image 251Y along the Y axis of the image 251. An image group 263 includes the image 253 when the height position of the sample is at the focus position (Z=0), a differential image 253X along the X axis of the image 253, and a differential image 253Y along the Y axis of the image 253. An image group 265 includes the image 255 when the height position of the sample is Z=−10, a differential image 255X along the X axis of the image 255, and a differential image 255Y along the Y axis of the image 255.

In FIG. 9, the differential image 251Y along the Y axis at the height position where Z=10 shows a maximum intensity higher than that of the other differential images 253Y and 255Y along the Y axis. This indicates that the diameter of the beam cross section along the Y axis at the height position where Z=10 is smaller than the diameters of the beam cross sections along the Y axis at the other height positions, and the obtained image is sharp in the Y axis direction.

The differential image 255X along the X axis at the height position where Z=−10 shows a maximum intensity higher than that of the other differential images 251X and 253X along the X axis. This indicates that the diameter of the beam cross section along the X axis at the height position where Z=−10 is smaller than the diameters of the beam cross sections along the X axis at the other height positions, and the obtained image is sharp in the X axis direction.

As described above, the image that is obtained by the beam obtained by the electron optical system having astigmatism has anisotropy of the sharpness depending on the height position of the sample with respect to the focus position. In the examples shown in FIGS. 7 and 9, the image of the sample at a position upper than the focus position (Z=0) shows high sharpness along the Y axis and low sharpness along the X axis. The image of the sample at a position lower than the focus position (Z=0) shows high sharpness along the X axis and low sharpness along the Y axis.

FIG. 10 shows a sharpness score of an image in the electron optical system having no astigmatism. In a graph 301, a horizontal axis represents the height position (position on the Z axis) of the sample, and a vertical axis represents the sharpness score (X sharpness score) on the X axis of an image. Each point indicates the X sharpness score in a respective one of the images 201, 203, and 205. The X sharpness score of the image 203 of the sample at the focus position (Z=0) is the highest, and the X sharpness scores of the images 201 and 205 of the sample at the positions (Z=−10, 10) above and below the focus position are low.

In a graph 302, a horizontal axis represents the height position (position on the 2 axis) of the sample, and a vertical axis represents a Y sharpness score of an image. Each point indicates the Y sharpness score in a respective one of the images 201, 203, and 205. The Y sharpness score of the image 203 of the sample at the focus position (Z=0) is the highest, and the Y sharpness scores of the images 201 and 205 of the sample at the positions (2=−10, 10) above and below the focus position are low.

A graph 303 shows a value obtained by subtracting the Y sharpness score from the X sharpness score of each of the images. The sharpness in each direction in the electron optical system having no astigmatism is almost the same, and a decrease in the sharpness in each direction occurring when the focus position is separated from the height position of the sample hardly depends on a direction in which the focus position is separated from the height position of the sample, but largely depends on only a separated amount. Therefore, the value obtained by subtracting the Y sharpness score from the X sharpness score at each height is a value close to 0 at any height.

Among aberrations of an optical system, in consideration of aberrations other than the focus deviation (defocus) and the first-order astigmatism, a change in the sharpness when the focus position is separated from the height position of the sample shows some dependence on the direction in which the focus position is separated. However, in a state in which a general electron microscope is appropriately adjusted, only a third-order spherical aberration may have such an influence, and the influence itself can be almost ignored except for observation at a high magnification such that a size of a pixel constituting an observation image is about the same as or less than an amount of the third-order spherical aberration. In addition, even in the observation at a high magnification as described above, since the behavior as described above based on the astigmatism occurs in the same manner, the effect described in the present invention does not greatly change in a large number of situations.

FIG. 11 shows a sharpness score of an image in the electron optical system having astigmatism. In a graph 351, a horizontal axis represents the height position (position on the Z axis) of the sample, and a vertical axis represents the X sharpness score of an image. Each point indicates the X sharpness score in a respective one of the images 251, 253, and 255. The X sharpness score of the image 255 of the sample at the position (Z=−10) lower than the position where Z=0 is the highest, and the X sharpness score of the image 251 of the sample at the position (Z=10) upper than the position where Z=0 is the lowest.

In a graph 352, a horizontal axis represents the height position (position on the Z axis) of the sample, and a vertical axis represents the Y sharpness score of an image. Each point indicates the Y sharpness score in a respective one of the images 251, 253, and 255. The Y sharpness score of the image 251 of the sample at the position (Z=10) upper than the position where Z=0 is the highest, and the X sharpness score of the image 255 of the sample at the position (Z=−10) lower than the position where Z=0 is the lowest.

A graph 353 shows a value obtained by subtracting the Y sharpness score from the X sharpness score of each of the images. The value of the image of the sample at the position (Z=−10) lower than the position where Z=0 is positive and is the largest. The value of the image of the sample at the position where Z=0 is a value close to 0 because the X sharpness score and the Y sharpness score are close to each other. The value of the image of the sample at the position (Z=10) upper than the position where Z=0 is negative and is the smallest.

As described above, in the electron optical system having astigmatism, the X sharpness score decreases as the height position of the sample approaches the position where Z=10 from the position where Z=−10, and the Y sharpness score increases as the height position of the sample approaches the position where Z=10 from the position where Z=−10. When the sample is at the position where Z=0, the X sharpness and the Y sharpness in the image are about the same score, and when the sample is at a position upper than the position where Z=0, the Y sharpness is high and the X sharpness is low in the image. On the other hand, when the sample is at a position lower than the position where Z=0, the X sharpness is high and the Y sharpness is low in the image.

As described above, the X sharpness score and the Y sharpness score change according to the electron beam cross-sectional shape. Specifically, the sharpness score is low in a direction in which the diameter of the cross-sectional shape is large, and the sharpness score is high in a direction in which the diameter is small. Hereinafter, a method for executing a focus adjustment and an astigmatism correction based on this finding will be described.

In the method described below, an electron beam is moved on a sample so as to form a one-dimensional scan trajectory including different scan directions. A sharpness score is calculated associated with the scan direction based on an obtained signal electron intensity (also referred to as a signal intensity). Information for the focus adjustment and the astigmatism correction is obtained based on a relation between the sharpness score and the scan direction.

FIG. 12 shows an example of a scan trajectory of an electron beam (spot) on a sample. FIG. 12 shows a scan trajectory of an electron beam by a white arrow on the sample 21 in a field of view. As shown in FIG. 12, the scan trajectory is circular. The control system 42 moves the electron beam once or a plurality of times so as to form a same circular trajectory.

FIG. 13 shows scan directions of the electron beam at several different positions of the circular scan trajectory shown in FIG. 12. A point on a scan trajectory 501 can be represented by an angle θ from the X axis. For example, the angle θ of a position P1 is 0°, the angle θ of a position P3 is 90°, the angle θ of a position P5 is 180°, and the angle θ of a position P7 is 270°.

The electron beam moves in a positive direction along the Y axis at the position P1, that is, in an upward direction in FIG. 13. The scan direction is 90° in terms of the angle θ. At the position P3, the electron beam moves in a negative direction along the X axis, that is, in a left direction in FIG. 13. The angle θ in the scan direction is 180°. At the position P5, the electron beam moves in a negative direction along the Y axis, that is, in a downward direction in FIG. 13. The angle θ in the scan direction is 270°. At the position P7, the electron beam moves in a positive direction along the X axis, that is, in a right direction in FIG. 13. The angle θ in the scan direction is 0°.

FIG. 14 shows movements of an electron beam (spot) on a sample and beam cross-sectional shapes at different positions in a scan trajectory in different combinations (states) of astigmatism and the position (also referred to as the Z position) on the Z axis of a sample surface. In the example in FIG. 14, a direction of astigmatism STG-X in an optical system is 0°. FIG. 14 shows three different amounts (−1, 0, 1) of the astigmatism STG-X. FIG. 14 shows three different Z positions (−1, 0, 1). The Z position (0) is a focus position when astigmatism is not present. The Z position (1) is a position (a position close to the electron beam source 1) upper than the Z position (0). The Z position (−1) is a position lower than the Z position (0).

When the astigmatism STG-X is positive (states 541, 542, and 543), the focus position on the X axis is present at a position lower than the Z position (0). The beam cross section shows an ellipse having a major axis along the X axis at the Z position (1) (state 541), shows a circle at the Z position (0) (state 542), and shows an ellipse having a major axis along the Y axis at Z (−1) (state 543).

When the astigmatism STG-X is negative (states 547, 548, and 549), the focus position on the X axis is present at a position upper than the Z position (0). The beam cross section shows an ellipse having a major axis along the Y axis at the Z position (1) (state 547), shows a circle at the Z position (0) (state 548), and shows an ellipse having a major axis along the X axis at Z (−1) (state 549).

When the astigmatism STG-X is 0 (states 544, 545, 546), no astigmatism is present in the optical system. The diameter of the beam cross section is the smallest at the Z position (0) (state 545), and increases as a distance from the Z position (0) increases (states 544 and 546). At the Z position (0), when the astigmatism STG-X is 0, the diameter of the beam cross section is the smallest (state 545).

The scan trajectory of the electron beam on the sample is circular as shown in FIG. 13 (circular scan). Specifically, the spot forms a circular scan trajectory in the counterclockwise direction, and sequentially passes through positions P1 to P8. The angles 8 at the positions P1 to P8 are 0°, 45°, 90°, 135°, 180° (−180°), 225° (−135°), 270° (−90°), and 315° (−45°), respectively.

FIG. 15 shows a relation between a spot position of an electron beam and a scan direction according to the circular scan shown in FIG. 14. In the graph in FIG. 15, a vertical axis represents the angle θ, and a horizontal axis represents time. A solid line 571 indicates a temporal change in the spot position, and a broken line 572 indicates a temporal change in the scan direction of the spot. In the example in FIG. 15, an angular velocity of the spot is constant. For example, the angle θ at the position P1 is 0, and an angle in the scan direction is 90°. The angle in the scan direction is advanced by 90° with respect to the angle at each of the positions.

FIG. 16 shows temporal changes in a spot position and a scan direction and a temporal change in a sharpness score at a plurality of Z positions due to a circular scan in an optical system in which astigmatism is corrected. The scan direction changes with time, and the temporal change in the sharpness score indicates a change with respect to the scan direction. The sharpness score at each of the positions in a scan trajectory can be calculated based on, for example, an absolute value of a differential of a signal intensity, and can be calculated using a difference from an immediately preceding signal intensity in the scan. In this example, it is assumed that a structure of a sample is isotropic as shown in FIG. 12 and is always detected on the scan trajectory.

The temporal changes in the spot position and the scan direction are the same as those in FIG. 15. Solid lines FP1, FP2, and FP3 indicate the temporal changes in the sharpness scores at different Z positions. Since the spot position and the scan direction change with time, FIG. 15 shows a change in the sharpness score with respect to the position and the scan direction in the scan trajectory.

The sharpness score at any of the Z positions is constant, and the sharpness score does not depend on the scan direction of the spot. Since the astigmatism is corrected, as shown in FIG. 14, the cross-sectional shape of the electron beam is circular at any of the Z positions (states 544, 545, 546). As described above, when a spot shape (the beam cross-sectional shape on the sample) is circular, the sharpness score does not significantly change with respect to the scan direction of the spot.

The sharpness score depends on a relation between the spot shape and the scan direction of the spot. The smaller a spot diameter in the scan direction, the higher the sharpness can be obtained. The spot shape in the optical system in which the astigmatism is corrected is circular. Therefore, a same sharpness score is obtained in any of the scan directions.

In the example shown in FIG. 16, a sharpness score FP1 is the smallest, and a sharpness score FP3 is the largest. As described above, in the same sample, the smaller the spot diameter, the higher the sharpness score can be obtained. Therefore, the spot diameter indicating the sharpness score FP3 is the smallest, and the spot diameter indicating the sharpness score FP1 is the largest. The spot corresponding to the sharpness score FP3 is in a state in which the sample is most focused.

FIG. 17 shows temporal changes in a spot position and a scan direction and a temporal change in a sharpness score due to a circular scan in an optical system having astigmatism of 0°. An upper graph is the same as the graph of the spot shape and the temporal change in the spot in the scan direction shown in FIGS. 15 and 16.

A middle graph shows a change in the sharpness score due to an elliptical spot having a major axis along the X axis. A solid line 574 indicates a change in the sharpness score due to a spot having a longer major axis and a shorter minor axis (larger astigmatism, which corresponds to 121 in FIG. 5), and a broken line 575 indicates a change in the sharpness score due to a spot having a shorter major axis and a longer minor axis (smaller astigmatism, which corresponds to 122 in FIG. 5).

The sharpness scores 574 and 575 show a same change with respect to the change in the spot in the scan direction. Specifically, the sharpness scores 574 and 575 continuously change in a same period as the circular scan (scan trajectory). The sharpness scores 574 and 575 show a maximum value when the angle θ in the spot scan direction is a direction (90° or −90°) perpendicular to the major axis. The sharpness scores 574 and 575 show a minimum value when the angle θ in the spot scan direction is a direction parallel to the major axis (0° or 180° (−180°)).

As described above, the sharpness score for one spot increases as the spot diameter of the spot in the scan direction decreases. The sharpness score for a different spot in a same scan direction increases as the spot diameter in the scan direction decreases. The minor axis of a spot (corresponding to 121 in FIG. 5) having a longer major axis is shorter than the minor axis of a spot (corresponding to 122 in FIG. 5) having a shorter major axis. Therefore, the sharpness score 574 of the spot having a longer major axis has a larger amplitude (a larger maximum value and a smaller minimum value) than the sharpness score 575 of the spot having a shorter major axis.

A lower graph shows a change in the sharpness score due to an elliptical spot having a major axis along the Y axis. A solid line 577 indicates a change in the sharpness score due to a spot having a longer major axis and a shorter minor axis (larger astigmatism, which corresponds to 125 in FIG. 5), and a broken line 578 indicates a change in the sharpness score due to a spot having a shorter major axis and a longer minor axis (smaller astigmatism, which corresponds to 124 in FIG. 5).

The sharpness scores 577 and 578 show a same change with respect to the change in the spot scan direction. Specifically, the sharpness scores 577 and 578 continuously change in a same period as the circular scan (scan trajectory). The sharpness scores 577 and 578 show a maximum value when the angle θ in the spot scan direction is a direction (0° or 180° (−180°)) perpendicular to the major axis. The sharpness scores 574 and 575 show a minimum value when the angle θ in the spot scan direction is a direction (90° or −90°) parallel to the major axis.

Similarly to the sharpness scores 574 and 575 in the middle graph, the sharpness score for one spot increases as the spot diameter of the spot in the scan direction decreases. The sharpness score for a different spot in a same scan direction increases as the spot diameter in the scan direction decreases. The sharpness score 577 for a spot (corresponding to 125 in FIG. 5) having a longer major axis has a larger amplitude (a larger maximum value and a smaller minimum value) than the sharpness score 578 for a spot (corresponding to 124 in FIG. 5) having a shorter major axis.

As shown in the comparison between the middle graph and the lower graph, the sharpness score with respect to the scan direction shows a phase corresponding to the direction of the long axis of the elliptical spot in the optical system having astigmatism. In addition, as described with reference to the middle graph and the lower graph, the larger the astigmatism, the longer the long axis of the elliptical spot and the shorter the short axis, the larger the amplitude of the sharpness score.

FIG. 18 shows a temporal change in a signal intensity obtained in one period of a circular scan and a temporal change in a sharpness score (an absolute value of a differential value of the signal intensity) in different combinations (states) of astigmatism and a Z position of a sample. In each of states 601 to 620, an upper graph shows the temporal change in the signal intensity, and a lower graph shows the temporal change in the sharpness score. FIG. 18 shows the results obtained by simulation, and a structure of the sample is isotropic as shown in FIG. 12 and corresponds to a result when the sample is always detected on the scan trajectory.

In each of the states 611 to 615 having no astigmatism in an optical system, the sharpness score is substantially constant. The state 612 at the Z position (0), which is a focus state, indicates a largest sharpness score. The state 612 is the optimum state for the astigmatism correction and the focus adjustment. In the states 611 to 615, the sharpness score decreases as the Z position is separated from the optimum state 612.

In the states 606 to 610 in which STG-X is 1, except for the state 607 at the Z position (0), a local peak of the sharpness score is gathered in the one scan period, and a macroscopic periodic change is shown. Phases of the sharpness scores in the states 608, 609, and 610 in which the Z position is positive are different from and opposite to a phase of the sharpness score in the state 606 in which the Z position is negative. The state 608 at the Z position (1) indicates an amplitude of a largest sharpness score. Although not shown, a state at the Z position (−1) also indicates an amplitude of a large sharpness score. The Z position (1) is a focus position on the Y axis, and the Z position (−1) is a focus position on the X axis.

In the states 601 to 605 in which STG-X is 2, except for the state 602 at the Z position (0), a local peak of the sharpness score is gathered in the one scan period, and a macroscopic periodic change is shown. Phases of the sharpness scores in the states 603, 604, and 605 in which the Z position is positive are different from and opposite to a phase of the sharpness score in the state 601 in which the Z position is negative. The state 604 at a Z position (2) or the state 601 at a Z position (−2) indicates an amplitude of a largest sharpness score. The Z position (2) is a focus position on the Y axis, and the Z position (−2) is a focus position on the X axis.

In the states 616 to 620 in which STG-X is −1, except for the state 617 at the Z position (0), a local peak of the sharpness score is gathered in the one scan period, and a macroscopic periodic change is shown. Phases of the sharpness scores in the states 618, 619, and 620 in which the Z position is positive are different from and opposite to a phase of the sharpness score in the state 616 in which the Z position is negative. The state 619 at the Z position (2) or the state 616 at the Z position (−2) indicates an amplitude of a largest sharpness score. The Z position (2) is a focus position on the X axis, and the Z position (−2) is a focus position on the Y axis. The sharpness scores in the states 616 and 618 to 620 have a phase opposite to that of the sharpness score at a same Z position where STG-X is positive.

A method for obtaining information for the focus adjustment and the astigmatism correction from the sharpness score will be described with reference to FIG. 19. FIG. 19 shows a change in a signal intensity with respect to a spot position due to a circular scan and a change in a sharpness score according to the change in the signal intensity. The spot position is represented by an angle with a reference axis (X axis) of 0°, and is associated with a spot scan direction as described above. That is, FIG. 19 shows the changes in the signal intensity and the sharpness score with respect to the scan direction.

As shown in FIG. 19, an amplitude (AC component), a sum or an average value (DC component), and a phase can be determined based on the sharpness score by a preset calculation. As understood from the above description, the amplitude of the AC component of the sharpness score indicates a magnitude of astigmatism. The sum or the average value (DC component) of the sharpness scores indicates a focus deviation amount. The phase of the AC component of the sharpness score indicates a direction (also referred to as the phase of astigmatism) of astigmatism of an optical system.

The control system 42 moves an electron beam on a sample in a circular shape and acquires a signal electron intensity detected by a detector. The control system 42 calculates a sharpness score of the signal intensity at each point in a scan trajectory. Accordingly, the control system 42 obtains the sharpness score associated with a scan direction of the electron beam as shown in FIG. 19.

The control system 42 determines, according to a preset calculation method, values of an amplitude of an AC component, a DC component, and a phase of the AC component in the sharpness score that changes according to a change in the scan direction. The scan direction of a spot of the electron beam is known, and the control system 42 can determine the amplitude and the phase by extracting a component (AC component) having periodicity corresponding to the scan direction. The DC component can be calculated based on measurement data before extracting a frequency component or based on the extracted frequency component. The control system 42 can set a focus position and an astigmatism correction amount to appropriate values by feeding back the obtained values to a focus position adjustment mechanism and an astigmatism correction mechanism.

For example, when the spot of the electron beam on the sample has a two-fold symmetric shape with first-order astigmatism, that is, an elliptical shape, scan is performed twice in long axis and short axis directions of the spot in one circular scan. As a result, while the scan direction changes in a range of 0° to 360°, the sharpness score changes with a period of 2 Hz. Similarly, a component having different periodicity according to symmetry of the shape of the spot of the electron beam appears in the change of the sharpness score. For example, when the spot of the electron beam on the sample has a three-fold symmetric shape, the sharpness score changes with a period of 3 Hz with respect to the change in the scan direction. Since an electron beam in a charged particle beam has six or less symmetry in a large number of cases, a periodic component corresponding to the change in the scan direction appearing in the sharpness score is correspondingly 6 Hz or less in a large number of cases.

A component having periodicity with respect to such a change in the scan direction may include a plurality of frequency components at the same time, and as an evaluation method thereof, for example, a method of Fourier-transforming the sharpness score with respect to the scan direction or a method of obtaining a dot product with an evaluation matrix corresponding to two orthogonal components constituting a specific periodic component can be used.

FIG. 20 is a flowchart showing an example of an automatic focus adjustment and an automatic astigmatism correction that are executed by the control system 42. The control system 42 sets a focus (position) as an initial condition (S101). The control system 42 scans a sample with an electron beam for one period (S102). For example, a scan trajectory of a spot of the electron beam on the sample is circular as described above.

The control system 42 sequentially acquires a signal intensity corresponding to each point in the scan trajectory, and calculates a sharpness score at each point (S103). The sharpness score can be calculated based on, for example, an absolute value of a difference from a signal intensity at an immediately preceding position. The control system 42 associates a scan direction at each position in the scan trajectory with the sharpness score, and analyzes a relation between the scan direction and the sharpness score (S104).

As a method for obtaining the scan direction at each position in the scan trajectory, a method of applying an arctangent (arctangent function) or the like to a differential value or a change amount of a current amount of a scan signal flowing through a scan coil in each direction used in scanning with an electron beam can be used.

The control system 42 calculates, based on the change in the sharpness score one scan period according to the evaluation, scores based on an amplitude and a phase of an AC component and an average value (DC component) using a preset calculation method (S105). As described above, a score based on the amplitude indicates an evaluation result of an astigmatism amount, and a score based on the phase indicates a direction of astigmatism of an optical system. A score based on the average value indicates an evaluation result of a focus deviation amount.

Next, the control system 42 determines whether a current focus position satisfies a preset end condition (S106). For example, when a range of a focus position for acquiring the sharpness score is set in advance and the current focus position is the boundary of the range, the current focus position satisfies the end condition. When the current focus position does not satisfy the end condition (S106: NO), the control system 42 changes the focus position by a predetermined amount (S107), and then returns to step S102.

When the current focus position satisfies the end condition (S106: YES), the control system 42 determines an optimum focus condition at which a focus score is maximized (S108). As described above, the evaluation based on the average value of the changing sharpness score corresponds to the focus score. The control system 42 determines, as the optimum focus condition, a focus condition indicating a maximum focus score among the focus scores at the observed focus positions (focus conditions). The control system 42 sets the determined optimum focus condition in a focus adjustment mechanism (S109).

Next, the control system 42 determines an astigmatism correction condition according to a preset relational expression based on a change in the score based on the amplitude of the sharpness score and a change in the score based on the phase of the sharpness score that are already acquired with respect to a change in the focus position. Examples of the relational expression used in this case include a relational expression in which a magnitude of astigmatism is obtained based on a difference between focus conditions corresponding to two conditions, and a relational expression in which the direction of astigmatism is obtained based on phase information of the sharpness score. Under the two conditions, the amplitude of the sharpness score is maximum when the focus position is changed. These relational expressions are an optimum astigmatism correction condition. The control system 42 sets the determined optimum astigmatism correction condition in an astigmatism correction mechanism (S111).

As described above, the automatic focus adjustment and the automatic astigmatism correction can be executed at high speed based on the characteristics of the sharpness score that changes according to the scan direction. Depending on a system design, the control system 42 may execute only one of the focus adjustment and the astigmatism correction. In the above example, the control system 42 generates information for executing the focus adjustment and the astigmatism correction, and automatically executes the focus adjustment and the astigmatism correction according to the information. Alternatively, the control system 42 may present the information for executing the focus adjustment and the astigmatism correction to a user in the output device 414 to assist the user in the focus adjustment and the astigmatism correction. This is the same in a focus adjustment method described below.

Next, an example of executing an automatic focus adjustment without executing an automatic astigmatism correction will be described. It is assumed that a necessary astigmatism correction is already executed. In this example, the focus adjustment is executed according to a method different from the above method. FIG. 21 shows a flowchart of the automatic focus adjustment.

The control system 42 sets a focus (position) as an initial condition (S151). The control system 42 scans a sample with an electron beam for one period (S152). For example, a scan trajectory of a spot of the electron beam on the sample is circular as described above.

The control system 42 sequentially acquires a signal electron intensity corresponding to each point in the scan trajectory, and calculates a sharpness score at each point (S153). The sharpness score can be calculated based on, for example, an absolute value of a difference from a signal intensity at an immediately preceding position. The control system 42 associates a scan direction at each position in the scan trajectory with the sharpness score, and analyzes a relation between the scan direction and the sharpness score (S154).

The control system 42 calculates sharpness scores corresponding to two predetermined orthogonal scan directions (referred to as a vertical direction and a horizontal direction) (S155). Although accuracy of the focus adjustment may be reduced, sharpness scores in non-orthogonal scan directions may be used. Further, the control system 42 generates a focus score based on these values (S156). The control system 42 generates the focus score based on, for example, a product or a sum of the sharpness scores in the two scan directions. In this way, by generating the focus score based on the sharpness scores in different directions, it is possible to appropriately execute the focus adjustment in various sample structures.

Next, the control system 42 determines whether a current focus position satisfies a preset end condition (S157). For example, when a range of a focus position for acquiring the sharpness score is set in advance and the current focus position is the boundary of the range, the current focus position satisfies the end condition. When the current focus position does not satisfy the end condition (S157: NO), the control system 42 changes the focus position by a predetermined amount (S158), and then returns to step S102.

When the current focus position satisfies the end condition (S157: YES), the control system 42 determines an optimum focus condition at which the focus score is maximized (S159). The control system 42 determines, as the optimum focus condition, a focus condition indicating a maximum focus score among the focus scores at the observed focus positions (focus conditions). The control system 42 sets the determined optimum focus condition in a focus adjustment mechanism (S160).

As described with reference to FIGS. 20 and 21, the control system 42 can correct a focus deviation or astigmatism based on the relation between the sharpness score and scan directions along different axes. In the above example, the electron beam (spot) is moved on a sample in a manner of forming a circular trajectory. The scan trajectory of the electron beam is not limited to the above example, and the focus adjustment and/or the astigmatism correction can be executed according to the signal intensity based on various scan trajectories.

FIG. 22 shows several other examples 511 to 522 of the scan trajectory of the electron beam (spot) on a sample. Each of the scan trajectories includes a position of the electron beam in a different scan direction. The scan trajectories 511, 512, 514, and 516 are curves, and the other scan trajectories are a plurality of straight lines. As shown in the scan trajectories 511 to 516, the scan trajectory may not be closed, and as shown in the scan trajectories 517 to 522, the scan trajectory may be closed. In addition, even if the scan trajectory is a free curve having no periodicity or symmetry, it is possible to evaluate the focus deviation or the astigmatism using the above methods.

The control system 42 may also move an electron beam so as to form the scan trajectory once or to form a same scan trajectory a plurality of times. The smaller the number of times of formation, the shorter a time for the focus adjustment and the astigmatism correction, and the smaller an influence of the electron beam on a sample. The control system 42 may form a same scan trajectory a plurality of times and determine, based on a plurality of signal intensities at a same position, sharpness scores of signal intensities associated with scan directions at the same position. Accordingly, an influence of noise can be reduced.

The scan trajectories 511 to 516 include different positions in a same scan direction. In such a scan trajectory, the control system 42 can calculate a sharpness score in one scan direction based on a signal intensity at one or a plurality of positions selected from different positions. For example, a largest sharpness score can be selected at different positions. In this way, by acquiring signal intensities in a same axis direction (a same direction or opposite directions) at different positions, it is possible to reduce an influence of a sample structure on the calculation of the sharpness score. The axis is not limited to a specific axis such as an X axis or a Y axis, and may have any direction.

When the scan trajectory includes more different directions, the focus adjustment and the astigmatism correction can be executed more accurately. In the example shown in FIG. 19, the scan trajectory 511, 512, 514, or 515 indicates a scan direction that continuously changes from 0° to 360°, and the scan trajectories 521 and 522 also include a large number of scan directions. For example, a change in the scan direction of the scan trajectory can have an angle range of 90° or more. With this angle range, information on the sharpness in two orthogonal directions can be obtained, and thus at least the focus adjustment can be executed more appropriately. In addition, the change in the scan direction of the scan trajectory may have an angle range of 180° or more. With this angle range, information on the sharpness in substantially all directions can be obtained, and thus the astigmatism can be corrected more appropriately in addition to the focus adjustment.

For example, as described with reference to FIG. 19, in order to execute the focus adjustment and the astigmatism correction more accurately based on the AC component and the DC component of the sharpness score, the scan trajectory 511, 512, 514, or 515 is used. These trajectories include all the scan directions, which change continuously (constantly).

FIG. 23 shows an example of correcting a focus deviation by combining a circular scan and a change in astigmatism of an optical system. For example, FIG. 23 shows an example of adding known astigmatism to an optical system in which astigmatism is corrected while a circular scan is repeated. FIG. 23 shows, from an uppermost graph toward a lowermost graph, a temporal change in a spot position on a sample represented by an angle, a temporal change in an astigmatism correction amount (STG-X), a temporal change in a spot diameter (solid line) along an X axis and a spot diameter (broken line) along a Y axis on the sample, a temporal change in a width of a probe with respect to a scan direction, and a temporal change in a sharpness score obtained with respect to a signal obtained by scan.

FIG. 23 assumes a state in which the sample is placed at a position above the Z position (0) in the example described above. The scan trajectory is circular, and the angular velocity is constant. The other scan trajectories 511, 512, 514, 515, and the like can also be used.

In the example in FIG. 23, the scan trajectory of a spot is a circle. The astigmatism to be applied is periodic, and the spot makes 23 rotations (circular scan) in one period change (for example, a minor increase from STG-X=−2 to +2). In the circular scan of 23 rotations, the astigmatism correction amount continues to change, and accordingly, a shape of the probe on the sample also changes.

In an optical system in which astigmatism is corrected, since the shape of the probe is an isotropic circle at any height as described above, the spot diameter (solid line) along the X axis is equal to the spot diameter (broken line) along the Y axis on the sample in a state (a state corresponding to a vertical line 701 in FIG. 23) in which the astigmatism correction amount (STG-X) is 0. As time elapses, the astigmatism correction amount (STG-X) gradually increases in a positive direction, and accordingly, the spot diameter along the Y axis on the sample decreases and the spot diameter along the X axis on the sample increases.

As the time further elapses, at some point in time, the spot diameter along the Y axis on the sample is minimized and then gradually increases, and on the other hand, the spot diameter along the X axis on the sample continues to increase monotonously. During this time, the probe repeatedly changes the scan direction on the sample at a period earlier than the change in the astigmatism correction amount (STG-X) due to the circular scan.

At this time, the sharpness score obtained based on a signal obtained when the probe is scanned in the X axis direction changes corresponding to the spot diameter along the X axis on the sample, and the sharpness score obtained based on a signal obtained when the probe is scanned in the Y axis direction changes corresponding to the spot diameter along the Y axis on the sample. As a result, the spot diameter along the Y axis on the sample described above is minimized, and the sharpness score is maximized when the probe is scanned in the Y axis direction at a timing close to a timing of the spot diameter being minimized.

The condition corresponding thereto is indicated by [2] in FIG. 23. On the other hand, under another condition in which the astigmatism correction amount is different, the spot diameter along the X axis on the sample is minimized, and the sharpness score is maximized when the probe is scanned in the X axis direction at a timing close to a timing of the spot diameter being minimized. The condition corresponding thereto is indicated by [1] in FIG. 23.

When the above contents are implemented under a condition that the astigmatism is sufficiently corrected, the astigmatism correction amounts (STG-X) corresponding to [1] and [2] have the same magnitude and are different only in reference numerals. The astigmatism correction amount (STG-X) corresponding to either or both of the above [1] and [2] is obtained, and the astigmatism correction amount (STG-X) is converted according to a predetermined relational expression, whereby the focus deviation amount can be obtained.

At this time, whether the focus is shifted in an upward direction or a downward direction with respect to the sample can be determined by evaluating the beam scan direction when the maximum sharpness score shown in [1] or [2] is obtained, that is, the phase of the change in the sharpness score as already described. In the example shown in FIG. 23, the Z position is positive, and the focus position is shifted downward with respect to the sample. When the Z position of the sample is negative and the focus position is shifted upward with respect to the sample, the phase of the sharpness score is opposite to the phase in FIG. 23.

Information of the focus deviation amount obtained in this manner is fed back to an adjustment of a Z position of a sample stage or an adjustment of a control parameter of an objective lens. Accordingly, it is possible to correct the focus deviation.

In the above example, unlike the examples shown in FIGS. 20 and 21, the focus position can be determined without adjusting the Z position of a sample stage or changing the control parameter of an objective lens. Therefore, an optimum condition of the focus position can be determined at higher speed.

FIG. 24 shows an example of adjusting astigmatism of an optical system by combining a circular scan and a change in the astigmatism. FIG. 24 shows an example in which, for example, a circular scan is repeated, and known astigmatism is further added to an optical system. In the optical system, astigmatism is not corrected and is present by a certain amount.

FIG. 24 shows, from an uppermost graph toward a lowermost graph, a temporal change in a spot position on a sample represented by an angle, a temporal change in an astigmatism correction amount (an X direction astigmatism correction amount, STG-X), a temporal change in a spot diameter (solid line) along an X axis and a spot diameter (broken line) along a Y axis on the sample, a temporal change in a width of a probe with respect to a scan direction, and a temporal change in a sharpness score obtained with respect to a signal obtained by scan.

FIG. 24 assumes a state in which the sample is placed at a position above the Z position (0) in the example described above. The scan trajectory is circular, and the angular velocity is constant. The other scan trajectories 511, 512, 514, 515, and the like can also be used.

In the example in FIG. 24, the scan trajectory of a spot is a circle. The astigmatism to be applied is periodic, and the spot makes 23 rotations (circular scan) in one period change (for example, a minor increase from STG-X=−2 to +2). In the circular scan of 23 rotations, the astigmatism correction amount continues changing, and accordingly, a shape of the probe on the sample also changes.

In an optical system in which astigmatism is not corrected and is present by a certain amount and a focus position and a position of a sample are shifted from each other, the spot diameter (solid line) along the X axis and the spot diameter (broken line) along the Y axis on the sample in a state in which the astigmatism correction amount (STG-X) is 0 (a state corresponding to a vertical line 702 in FIG. 24) have different values. When the circular scan is performed in this state, signals obtained by scanning the sample with different probe widths according to the scan direction are obtained. Since the sharpness score of the signal changes depending on the scan direction, the sharpness score shows a periodic change (vibration) according to a period of the circular scan.

When the astigmatism correction amount (STG-X) is further changed from this state, an amplitude of the periodic change of the sharpness score corresponding to the period of the circular scan described above is minimized under any condition. This corresponds to a condition indicated by [3] in FIG. 24, and is a condition in which the astigmatism originally present in the optical system is corrected in a direction. In the direction, the astigmatism correction amount (STG-X) is changed. By converting the astigmatism correction amount (STG-X) at this time according to a predetermined relational expression, it is possible to measure the magnitude of the astigmatism present in the optical system, and by feeding back a measurement result to an astigmatism correction mechanism, it is possible to adjust the device to a state in which the astigmatism is actually corrected.

In the above example, even when astigmatism in different directions is present in the optical system, the amplitude of the periodic change in the sharpness score is also minimized under the condition shown in [3 ]. In this case, after the astigmatism is corrected in one direction, the astigmatism is corrected in another direction by the same procedure, so that it is possible to appropriately correct an astigmatism component in any direction.

The astigmatism correction amount in the above example may be implemented by an astigmatism correction in any direction obtained by combining astigmatism correction components (STG-X, STG-Y) in different directions orthogonal to each other. As a more preferable example, the astigmatism correction amount may be implemented by directly evaluating a direction of astigmatism from a phase component of vibration generated in a sharpness score of a signal obtained by performing a circular scan in a state (a state corresponding to a vertical line 702 in FIG. 24) in which the astigmatism correction amount is 0, and using an astigmatism correction component for correcting the aberration in that direction.

As another preferable example, by performing a circular scan while changing the astigmatism correction amount in one direction, evaluating a direction of astigmatism in each state from a phase component of vibration generated in the sharpness score of an obtained signal, and executing comparison with a component of an added astigmatism correction amount whose magnitude and direction are known, it is possible to measure an astigmatism component in another direction orthogonal to the direction in which the astigmatism correction is executed, and to simultaneously correct the aberration components in the two orthogonal directions based on a measurement result.

In this example, when the astigmatism correction amount (STG-X) is changed in the same manner as in the example described with reference to FIG. 23, the spot diameter along the X axis on the sample is also minimized under any condition, and the sharpness score is also maximized when the probe is scanned in the X axis direction at a timing close to a timing of the spot diameter being minimized. A condition corresponding thereto is indicated by [1 ] in FIG. 24. Further, under a different condition, the spot diameter along the Y axis on the sample is minimized, and the sharpness score is maximized when the probe is scanned in the Y axis direction at a timing close to a timing of the spot diameter being minimized.

A condition corresponding thereto is indicated by [2] in FIG. 24. Here, an average of the astigmatism correction amounts (STG-X) corresponding to [1] and [2] is obtained, and the average is converted according to a predetermined relational expression, whereby the focus deviation amount with respect to the sample can be measured. Alternatively, the focus deviation amount with respect to the sample can also be measured by obtaining a difference between the condition indicated by [3] in FIG. 24 and the astigmatism correction amount (STG-X) of [1] or [2] and converting the difference according to a predetermined relational expression.

In the above example, unlike the examples shown in FIGS. 20 and 21, the optimum conditions of the focus position and the astigmatism correction can be determined without adjusting a Z position of a sample stage or changing a control parameter of an objective lens.

In the example described with reference to FIG. 24, instead of the astigmatism correction amount, the focus position or the sample position can be changed. In this case, when the graph of the temporal change in the X astigmatism correction amount (STG-X) shown below the uppermost graph of FIG. 24 is viewed as a change in the focus position or a change in the sample position (a reference numeral of the direction is inverted from the change in the focus position), a same result can be obtained for the elements shown in the other graphs.

In this case, the focus position or the sample position is changed in a state in which a circular scan is repeated in an optical system having astigmatism, and the sharpness score that is obtained based on a signal intensity obtained at that time is evaluated by focusing on a same element as that in the examples described above, whereby it is possible to measure the astigmatism amount or the focus deviation amount of the optical system.

As a method for evaluating the sharpness score in the above examples, a plurality of generally known methods can be used. For example, a filter or transformation such as a differential filter, wavelet transformation, or Fourier transformation is applied to the obtained signal intensity, and an obtained coefficient can be evaluated as it is, or using a numerical value calculated based on the obtained coefficient according to a predetermined expression. As in these examples, the calculation of the score for adjusting the astigmatism and/or the focus can also be obtained by using a filter using a predetermined kernel.

The invention is not limited to the examples described above, and includes various modifications. For example, the above examples have been described in detail for easy understanding of the invention, and the invention is not necessarily limited to those including all the configurations described above. In addition, a part of a configuration of one example can be replaced with a configuration of another example, and a configuration of an example can be added to a configuration of another example. A part of the configuration of each example may be added to, deleted from, or replaced with another configuration.

The above configurations, functions, process units, and the like may be partially or entirely implemented by hardware through design using an integrated circuit and the like. The above configurations, functions, and the like may be implemented by software by a processor interpreting and executing a program for implementing the functions. Information such as a program, a table, and a file for implementing the functions can be stored in a recording device such as a memory, a hard disk, and a solid state drive (SSD), or a recording medium such as an IC card or an SD card.

Control lines and information lines that are considered to be necessary for description are shown, and all control lines and information lines are not necessarily shown in a product. Actually, it may be considered that almost all the configurations are connected to one another.

The invention claimed is:

1. A charged particle beam system comprising:

a charged particle beam device configured to emit a charged particle beam from a charged particle source to a sample via a charged particle optical system;

an astigmatism correction device that includes an octupole coil; and a control system configured to control the charged particle beam device and the astigmatism correction device, wherein the control system:

controls the astigmatism correction device to selectively deform a cross-sectional shape of the charged particle beam, scans the sample with the charged particle beam in a manner of forming a one-dimensional scan trajectory, acquires a one-dimensional discrete image signal corresponding to the one-dimensional scan trajectory, designates each of target data points from a plurality of data points of the one-dimensional discrete image signal and identifies consecutive data points acquired in a continuous order before and after each of the target data points in process of obtaining the one-dimensional discrete image signal, calculates a scan direction θ that is an orientation of the one-dimensional scan trajectory when each of the target data points was acquired, based on differences in positions of the charged particle beam on the sample while obtaining each of the target data points and the consecutive data points, calculates a first evaluation value based on values of each of the target data points and the consecutive data points, the first evaluation value representing a sharpness of the one-dimensional discrete image signal or being a value obtained by applying a filter using a predetermined kernel to the one-dimensional discrete image signal, obtains first data that represents relations between the first evaluation value of the target data points with respect to the scan direction θ, performs a Fourier transform on the first data with respect to the scan direction θ in order to obtain an angular-direction complex spectrum, and generates, based on a result of evaluating a complex signal component that correspond to an integer-order mode from a $0^{th}$ order to a $2^{nd}$ order in the scan direction θ within the angular-direction complex spectrum, information on at least one of a focus deviation and an astigmatism of the charged particle optical system.

2. The charged particle beam system according to claim 1, wherein the control system further:

corrects, based on the information, at least one of the focus deviation and the astigmatism of the charged particle optical system.

3. The charged particle beam system according to claim 1, wherein the one-dimensional scan trajectory includes different positions where scan directions are the same or opposite, and the control system determines, based on signal intensities at the different positions, scores of the first evaluation value.

4. The charged particle beam system according to claim 1, wherein the control system moves the charged particle beam in a manner of forming the one-dimensional scan trajectory a plurality of times, and determines, based on a plurality of a data point at a same position, the scan direction θ and the first evaluation value at the same position.

5. The charged particle beam system according to claim 1, wherein the one-dimensional scan trajectory is a closed line formed continuously along an outer edge of a region of finite size on the sample.

6. The charged particle beam system according to claim 5, wherein, the scan direction of the one-dimensional scan trajectory is changed in an angle range of 90° or more.

7. The charged particle beam system according to claim 1, wherein the control system further:

generates the information on the focus deviation from the complex signal component corresponding to a $0^{th}$ order mode in the scan direction 0 within the angular-direction complex spectrum.

8. The charged particle beam system according to claim 7, wherein the control system uses amplitudes of the complex signal components to evaluate the complex signal components.

9. The charged particle beam system according to claim 7, wherein the control system uses a phase of the complex signal component to evaluate a direction of the astigmatism of the charged particle optical system.

10. The charged particle beam system according to claim 1, wherein the control system determines the first evaluation value under a plurality of conditions in which a sample position, a focus, or an astigmatism amount of the charged particle optical system is changed.

11. A method for controlling a charged particle beam device, the method comprising:

selectively deforming a cross-sectional shape of a charged particle beam emitted by controlling an octupole coil;

scanning a sample with the charged particle beam via a charged particle optical system in a manner of forming a one-dimensional scan trajectory;

acquiring a one-dimensional discrete image signal corresponding to the one-dimensional scan trajectory;

designating each of target data points from a plurality of data points of the one-dimensional discrete image signal and identifies consecutive data points acquired in a continuous order before and after each of the target data points in process of obtaining the one-dimensional discrete image signal;

calculating a scan direction θ that is an orientation of the one-dimensional scan trajectory when each of the target data points was acquired, based on differences in positions of the charged particle beam on the sample while obtaining each of the target data points and the consecutive data points, the first evaluation value representing a sharpness of the one-dimensional discrete image signal or being a value obtained by applying a filter using a predetermined kernel to the one-dimensional discrete image signal;

calculating a first evaluation value based on values of each of the target data points and the consecutive data points;

obtaining first data that represents relations between the first evaluation value of the target data points with respect to the scan direction θ;

performing a Fourier transform on the first data with respect to the scan direction θ in order to obtain an angular-direction complex spectrum; and generating, based on a result of evaluating a complex signal component that correspond to an integer-order mode from a $0^{th}$ order to a $2^{nd}$ order in the scan direction θ within the angular-direction complex spectrum, information on at least one of a focus deviation and an astigmatism of the charged particle optical system.

12. The charged particle beam system according to claim 1, wherein the control system generates the information on a 2-fold symmetric astigmatism from the complex signal component corresponding to a 2nd order mode in the scan direction θ within the angular-direction complex spectrum.

13. The charged particle beam system according to claim 1, wherein the first evaluation value is obtained by applying one of a wavelet transformation or a Fourier transformation to the one-dimensional discrete image signal.

14. The charged particle beam system according to claim 1, wherein:

the charged particle beam device includes a scan deflector, the position of the charged particle beam on the sample is determined by an X scan signal and a Y scan signal for the scan deflector, the X scan signal and the Y scan signal corresponds to deflection amounts of two orthogonal directions, respectively, and the control system determines the scan direction 0 based on an amount of change in the X scan signal between the target data point and the consecutive data points and an amount of change in the Y scan signal between the target data point and the consecutive data points.

15. The charged particle beam system according to claim 1, wherein the octupole coil includes an X-axis astigmatism correction coil and a Y-axis astigmatism correction coil and the X-axis astigmatism correction coil is disposed at a position rotated by 45 degrees about a center of the optical axis with respect to an arrangement position of the Y-axis astigmatism correction coil.

16. The method of claim 11, wherein the octupole coil includes an X-axis astigmatism correction coil and a Y-axis astigmatism correction coil and the X-axis astigmatism correction coil is disposed at a position rotated by 45 degrees about a center of the optical axis with respect to an arrangement position of the Y-axis astigmatism correction coil.

* * * * *